United States Patent
Han et al.

(10) Patent No.: US 9,960,379 B2
(45) Date of Patent: May 1, 2018

(54) WHITE ORGANIC LIGHT EMITTING DEVICE

(71) Applicant: LG Display Co., Ltd., Seoul (KR)

(72) Inventors: Mi-Young Han, Paju-si (KR); Chang Wook Han, Seoul (KR); Tae Il Kum, Paju-si (KR); Gwi Jeong Cho, Daegu (KR); Tae Shick Kim, Yongin-si (KR); Se Ung Kim, Seoul (KR); Hee Dong Choi, Uiwang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days. days.

(21) Appl. No.: 15/618,017

(22) Filed: Jun. 8, 2017

(65) Prior Publication Data

US 2017/0279059 A1  Sep. 28, 2017

Related U.S. Application Data

(63) Continuation of application No. 14/804,124, filed on Jul. 20, 2015, now Pat. No. 9,711,747.

(30) Foreign Application Priority Data

Oct. 27, 2014  (KR) .................. 10-2014-0146362
Apr. 9, 2015   (KR) .................. 10-2015-0050391

(51) Int. Cl.
*H01L 51/50* (2006.01)
*H01L 51/52* (2006.01)

(52) U.S. Cl.
CPC ........ *H01L 51/504* (2013.01); *H01L 51/5044* (2013.01); *H01L 51/5278* (2013.01); *H01L 51/5265* (2013.01)

(58) Field of Classification Search
CPC ............. H01L 51/5278; H01L 51/5265; H01L 51/5262; H01L 51/504; H01L 51/508;
(Continued)

(56) References Cited

U.S. PATENT DOCUMENTS 5,674,636 A * 10/1997 Dodabalapur ...... H01L 51/5265
                                                  313/504
2006/0087225 A1   4/2006 Liao et al.
(Continued)

FOREIGN PATENT DOCUMENTS

CN   102281660 A   12/2011
CN   103329621 A    9/2013
(Continued)

OTHER PUBLICATIONS

Office Action for Chinese Patent Application No. CN 201510531887.1, dated Feb. 4, 2017, 18 Pages.
(Continued)

*Primary Examiner* — Caridad Everhart
(74) *Attorney, Agent, or Firm* — Fenwick & West LLP

(57) ABSTRACT

Disclosed is a white organic light emitting device for enhancing emission efficiency and a color viewing angle or a color reproduction rate. The white organic light emitting device includes a first emission part between a first electrode and a second electrode, the first emission part having a first emission layer, a second emission part on the first emission part, the second emission part having a second emission layer, and a third emission part on the second emission part, the third emission part having a third emission layer. At least two emission layers of the first to third emission layers emit lights having a same color to enhance emission efficiency and a color viewing angle, and the at least two emission layers are adjacent to each other.

30 Claims, 13 Drawing Sheets

(58) Field of Classification Search
CPC ............ H01L 51/5044; H01L 27/3209; H01L 51/5281; H01L 2251/5307
See application file for complete search history.

(56) References Cited

U.S. PATENT DOCUMENTS

| | | | |
|---|---|---|---|
| 2007/0024168 A1* | 2/2007 | Nishimura | C09K 11/06 313/110 |
| 2009/0102362 A1 | 4/2009 | Lee et al. | |
| 2011/0073844 A1 | 3/2011 | Pieh et al. | |
| 2011/0114981 A1 | 5/2011 | Higaki et al. | |
| 2011/0133227 A1 | 6/2011 | Lee et al. | |
| 2012/0161111 A1 | 6/2012 | Chiang et al. | |
| 2012/0241794 A1 | 9/2012 | Seo et al. | |
| 2012/0248971 A1* | 10/2012 | Okuyama | C09K 11/06 313/504 |
| 2013/0292664 A1 | 11/2013 | Nishimura et al. | |
| 2014/0084269 A1 | 3/2014 | Weaver et al. | |
| 2015/0014674 A1 | 1/2015 | Wehlus et al. | |
| 2016/0164042 A1 | 6/2016 | Cho et al. | |

FOREIGN PATENT DOCUMENTS

| | | |
|---|---|---|
| DE | 102012202839 A1 | 8/2013 |
| EP | 2330651 A2 | 6/2011 |
| JP | 2007-012369 A | 1/2007 |
| KR | 20110035048 | 4/2011 |

OTHER PUBLICATIONS

Office Action for U.S. Appl. No. 14/804,124, dated Sep. 23, 2016, 16 Pages.

* cited by examiner

WHITE ORGANIC LIGHT EMITTING DEVICE

CROSS-REFERENCE TO RELATED APPLICATIONS

This application is a continuation of U.S. patent application Ser. No. 14/804,124 filed on Jul. 20, 2015, which claims the benefit of Korean Patent Application No. 10-2014-0146362 filed on Oct. 27, 2014, and Korean Patent Application No. 10-2015-0050391 filed on Apr. 9, 2015, all of which are hereby incorporated by reference as if fully set forth herein.

BACKGROUND

Field of the Invention

The present invention relates to an organic light emitting device, and more particularly, to a white organic light emitting device for enhancing emission efficiency and color viewing angle or color reproduction rate.

Discussion of the Related Art

Recently, as society advances to the information-oriented society, the field of display apparatuses which visually express an electrical information signal is rapidly advancing. Flat panel display (FPD) apparatuses, having excellent performance in terms of thinning, lightening, and low power consumption, have been developed.

Examples of the FPD apparatuses include LCD apparatuses, plasma display panel (PDP) apparatuses, field emission display (FED) apparatuses, organic light emitting display apparatuses, etc.

In particular, the organic light emitting display apparatuses are self-emitting devices. In comparison with other FPD apparatuses, the organic light emitting display apparatuses have a fast response time, high emission efficiency, high luminance, and a wide viewing angle.

An organic light emitting device includes an organic emission layer which is formed between two electrodes. An electron and a hole are injected from the two electrodes into the organic emission layer, and an exciton is generated by recombination of the electron with the hole. The organic light emitting device is a device using the principle that light is emitted when the generated exciton is dropped from an excited state to a ground state.

SUMMARY

Organic light emitting devices realize full color by using a plurality of sub-pixels which respectively emit red (R) light, green (G) light, and blue (B) light. The plurality of sub-pixels, which respectively emit the red light, the green light, and the blue light, show color reproduction rates by using red (R) color coordinates, green (G) color coordinates, and blue (B) color coordinates, respectively. Color coordinates are highly dependent on a material of an emission layer. Particularly, a phosphorescent material contributes a triplet exciton to emit light and thus enables a high-efficiency device to be more easily implemented than that of a fluorescent material.

However, an effort to enhance color coordinates and color reproduction rate of an organic light emitting device is being made according to the requirements of consumers who desire good image quality.

In one method, there is a method that uses a single layer as an emission layer. The method may manufacture a white organic light emitting device by using a single material or by doping two or more kinds of materials. For example, there is a method where a red dopant and a green dopant are applied to a blue host, or a red dopant, a green dopant, and a blue dopant are added to a host material having high bandgap energy. However, the energy transfer to the dopant is incomplete, and it is difficult to adjust a balance of white light.

Moreover, a component of a dopant in a corresponding emission layer is limited due to a characteristic of a dopant itself. Also, mixing of emission layers focuses on realizing white light, and thus, a wavelength characteristic of having an emission peak value at a wavelength other than red, green, and blue occurs. For this reason, red emission efficiency, green emission efficiency, and blue emission efficiency are reduced due to an undesired peak wavelength value.

In another method, a structure may be provided where white light is emitted by stacking two emission layers having a complementary color relationship. However, in the structure, a difference between a peak wavelength range of each emission layer and a transmissive range of a color filter occurs when white light passes through the color filter. For this reason, a color range capable of expression is narrowed, and consequently, it is difficult to realize a desired color reproduction rate.

Moreover, when a blue emission layer and a yellow-green emission layer are provided as two emission layers, due to a cavity peak difference, a spectrum change rate based on a viewing angle is changed in the blue emission layer and the yellow-green emission layer. Therefore, a cavity peak of the yellow-green emission layer is adjusted to a position deviating from a desired position so as to control a spectrum change rate based on a viewing angle of each of the blue emission layer and the yellow-green emission layer, and for this reason, red efficiency, green efficiency, and blue efficiency are reduced.

Therefore, the inventors recognize the above-described problems, and have experimented on various methods for enhancing red efficiency, green efficiency, and blue efficiency and enhancing color reproduction rate or color viewing angle based on a viewing angle in consideration of a spectrum change rate and a cavity peak of each emission layer.

Therefore, through various experiments, the inventors have invented a white organic light emitting device having a new structure for enhancing red efficiency, green efficiency, and blue efficiency and enhancing an emission efficiency of an emission layer and a color reproduction rate or a color viewing angle based on a viewing angle.

Accordingly, the present invention is directed to providing a white organic light emitting device that substantially obviates one or more problems due to limitations and disadvantages of the related art.

An aspect of the present invention is directed to providing a white organic light emitting device in which an emission position of an emission layer is optimized, thereby enhancing red efficiency, green efficiency, blue efficiency, an emission efficiency of an emission layer, and panel efficiency.

Another aspect of the present invention is directed to providing a white organic light emitting device in which at least two emission layers which emit the same color light are provided, thereby enhancing device efficiency and a color reproduction rate or a color viewing angle based on a viewing angle.

The objects of the present invention are not limited to the aforesaid, but other objects not described herein will be clearly understood by those skilled in the art from descriptions below.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided a white organic light emitting device including: a first emission part between a first electrode and a second electrode, the first emission part having a first emission layer; a second emission part on the first emission part, the second emission part having a second emission layer; and a third emission part on the second emission part, the third emission part having a third emission layer, wherein at least two emission layers of the first to third emission layers respectively emit lights having the same color to enhance emission efficiency and a color viewing angle, and the at least two emission layers are adjacent to each other, thereby enhancing red efficiency, green efficiency, blue efficiency, an emission efficiency of an emission layer, panel efficiency, and a color reproduction rate or a color viewing angle based on a viewing angle.

The at least two emission layers may include the first emission layer and the second emission layer.

The first and second emission layers may include at least one of a blue emission layer, a deep blue emission layer, and a sky blue emission layer.

A peak wavelength of the first emission layer may be within a range of 440 nm to 480 nm, and a peak wavelength of the second emission layer may be within a range of 440 nm to 480 nm.

An emission layer, emitting light having a color different from the colors of the lights emitted from the at least two emission layers, may include at least one of a yellow-green emission layer, a green emission layer, a red emission layer and a green emission layer, a yellow emission layer and a red emission layer, a yellow-green emission layer and a red emission layer, or a combination thereof.

A peak wavelength of the third emission layer, which emits light having a color different from the colors of the lights emitted from the at least two emission layers, for example a peak wavelength of the third emission layer, may be within a range of 540 nm to 575 nm.

The at least two emission layers may be closer to the first electrode than the second electrode.

A color viewing angle may be equal to or less than 0.016 when a viewing angle of light emitted from the white organic light emitting device is 60 degrees.

A position of the first electrode may be within a range of 500 nm to 600 nm with respect to the second electrode.

An emission position of the third emission layer may be within a range of 20 nm to 80 nm with respect to the second electrode.

An emission position of the second emission layer may be within a range of 150 nm to 200 nm with respect to the second electrode.

An emission position of the first emission layer may be within a range of 270 nm to 330 nm with respect to the second electrode.

A position of the second electrode may be within a range of 500 nm to 600 nm with respect to the first electrode.

An emission position of the first emission layer may be within a range of 100 nm to 150 nm with respect to the first electrode.

An emission position of the second emission layer may be within a range of 240 nm to 280 nm with respect to the first electrode.

An emission position of the third emission layer may be within a range of 370 nm to 410 nm with respect to the first electrode.

In another aspect of the present invention, there is provided a white organic light emitting device including: a first emission part between a first electrode and a second electrode, the first emission part having a first emission layer; a second emission part on the first emission part, the second emission part having a second emission layer; and a third emission part on the second emission part, the third emission part having a third emission layer, wherein at least two emission layers of the first to third emission layers include a plurality of emission layers emitting lights having same color, based on a cavity peak and a spectrum change rate of each of the first to third emission layers, thereby enhancing red efficiency, green efficiency, blue efficiency, an emission efficiency of an emission layer, panel efficiency, and a color reproduction rate or a color viewing angle based on a viewing angle.

The plurality of emission layers may include the first emission layer and the second emission layer, and the first emission layer and the second emission layer may be adjacent to each other.

Due to the plurality of emission layers being adjacent to each other and emitting the lights having the same color, a spectrum change rate of an emission layer emitting light having a color different from the color of the lights emitted from the plurality of emission layers may be almost similar to a spectrum change rate of the plurality of emission layers.

Due to the plurality of emission layers emitting the lights having the same color, a spectrum change rate of an emission layer emitting light having a color different from the color of the lights emitted from the plurality of emission layers may be almost similar to a spectrum change rate of the plurality of emission layers.

A cavity peak of the emission layer emitting light having the color different from the color of the lights emitted from the plurality of emission layers is located in an emission area by a configuration where the spectrum change rate of the emission layer emitting light having the color different from the color of the lights emitted from the plurality of emission layers may be almost similar to the spectrum change rate of the plurality of emission layers.

A cavity peak of an emission layer emitting light having a color different from the color of the lights emitted from the plurality of emission layers, and a cavity peak of the plurality of emission layers emitting the lights having the same color may be located in an emission area by the plurality of emission layers.

A peak wavelength corresponding to an emission area of the plurality of emission layers may be within a range of 440 nm to 480 nm, and a peak wavelength corresponding to an emission area of an emission layer emitting the light having a color different from the color of the lights emitted from the plurality of emission layers, may be within a range of 540 nm to 575 nm.

The plurality of emission layers emitting the lights having the same color may be closer to the first electrode than the second electrode.

Emission positions of the first to third emission layers may be adjusted to enhance emission efficiency and a color viewing angle, based on a spectrum change rate and a cavity peak of each of the first to third emission layers.

A position of the first electrode may be within a range of 500 nm to 600 nm with respect to the second electrode.

An emission position of the third emission layer may be within a range of 20 nm to 80 nm with respect to the second electrode.

An emission position of the second emission layer may be within a range of 150 nm to 200 nm with respect to the second electrode.

An emission position of the first emission layer may be within a range of 270 nm to 330 nm with respect to the second electrode.

A color viewing angle may be equal to or less than 0.016 when a viewing angle of light emitted from the white organic light emitting device is 60 degrees.

A position of the second electrode may be within a range of 500 nm to 600 nm with respect to the first electrode.

An emission position of the first emission layer may be within a range of 100 nm to 150 nm with respect to the first electrode.

An emission position of the second emission layer may be within a range of 240 nm to 280 nm with respect to the first electrode.

An emission position of the third emission layer may be within a range of 370 nm to 410 nm with respect to the first electrode.

In another aspect of the present invention, there is provided a white organic light emitting device including: a first emission part between a first electrode and a second electrode, the first emission part having a first emission layer; a second emission part on the first emission part, the second emission part having a second emission layer; and a third emission part on the second emission part the third emission part having a third emission layer, wherein the order of the first emission part, the second emission part, and the third emission part are adjusted based on a cavity peak and a spectrum change rate of each of the first to third emission layers, thereby enhancing red efficiency, green efficiency, blue efficiency, an emission efficiency of an emission layer, panel efficiency, and a color reproduction rate or a color viewing angle based on a viewing angle.

At least two emission layers of the first to third emission layers may be configured with a plurality of emission layers emitting lights having the same color.

The plurality of emission layers emitting the lights having the same color may be closer to the first electrode than the second electrode.

The plurality of emission layers emitting the lights having the same color may include the first emission layer and the second emission layer, and the first emission layer and the second emission layer may be adjacent to each other.

Due to the plurality of emission layers being adjacent to each other and emitting the lights having the same color, a spectrum change rate of an emission layer emitting light having a color different from the color of the lights emitted from the plurality of emission layers may be almost similar to a spectrum change rate of the plurality of emission layers emitting the lights having the same color.

Due to the plurality of emission layers emitting the lights having the same color, a spectrum change rate of an emission layer emitting light having a color different from the color of the lights emitted from the plurality of emission layers may be almost similar to a spectrum change rate of the plurality of emission layers.

A cavity peak of the emission layer emitting light having a color different from the color of the lights emitted from the plurality of emission layers is located in an emission area by a configuration where the spectrum change rate of the emission layer emitting light having the color different from the color of the lights emitted from the plurality of emission layers may be almost similar to the spectrum change rate of the plurality of emission layers.

A cavity peak of an emission layer emitting light having a color different from the color of the lights emitted from the plurality of emission layers, and a cavity peak of the plurality of emission layers may be located in an emission area by the plurality of emission layers emitting the lights having the same color.

A peak wavelength corresponding to an emission area of each of the plurality of emission layers may be within a range of 440 nm to 480 nm, and a peak wavelength corresponding to an emission area of an emission layer emitting the light having a color different from the color of the lights emitted from the plurality of emission layers may be within a range of 540 nm to 575 nm.

Emission positions of the first to third emission layers may be adjusted to enhance emission efficiency and a color viewing angle, based on a spectrum change rate and a cavity peak of each of the first to third emission layers.

A position of the first electrode may be within a range of 500 nm to 600 nm with respect to the second electrode.

An emission position of the third emission layer may be within a range of 20 nm to 80 nm with respect to the second electrode.

An emission position of the second emission layer may be within a range of 150 nm to 200 nm with respect to the second electrode.

An emission position of the first emission layer may be within a range of 270 nm to 330 nm with respect to the second electrode.

A color viewing angle may be equal to or less than 0.016 when a viewing angle of light emitted from the white organic light emitting device is 60 degrees.

A position of the second electrode may be within a range of 500 nm to 600 nm with respect to the first electrode.

An emission position of the first emission layer may be within a range of 100 nm to 150 nm with respect to the first electrode.

An emission position of the second emission layer may be within a range of 240 nm to 280 nm with respect to the first electrode.

An emission position of the third emission layer may be within a range of 370 nm to 410 nm with respect to the first electrode.

Details of embodiments are included in a detailed description and the drawings.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Figure 1:
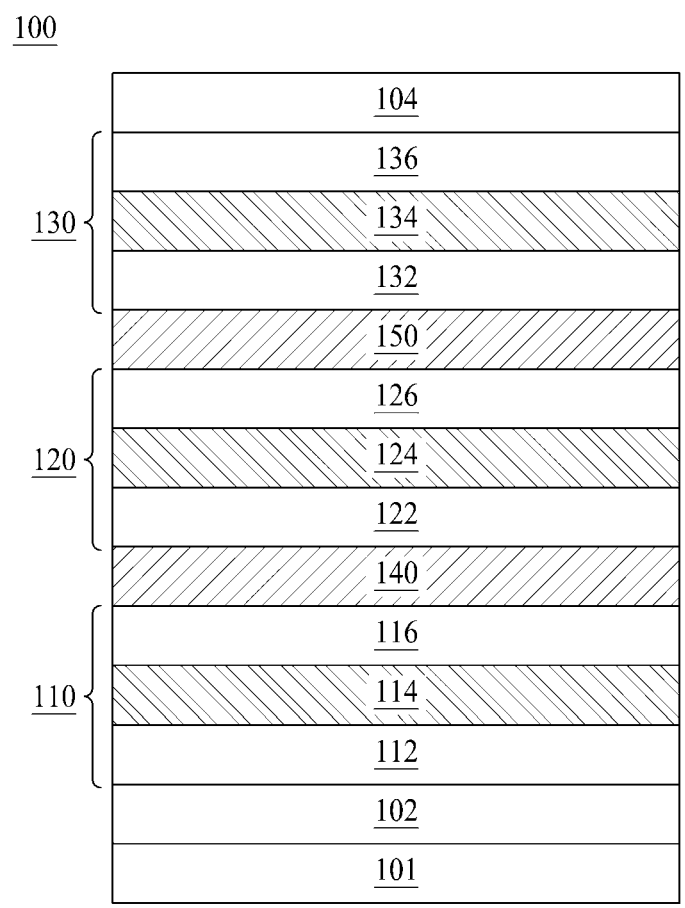
FIG. 1 is a schematic cross-sectional view illustrating a white organic light emitting device according to a first embodiment of the present invention.

Reference will now be made in detail to the exemplary embodiments of the present invention, examples of which are illustrated in the accompanying drawings. Wherever possible, the same reference numbers will be used throughout the drawings to refer to the same or like parts.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

A shape, a size, a ratio, an angle, and a number disclosed in the drawings for describing embodiments of the present invention are merely an example, and thus, the present invention is not limited to the illustrated details. Like reference numerals refer to like elements throughout. In the following description, when the detailed description of the relevant known function or configuration is determined to unnecessarily obscure the important point of the present invention, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in a co-dependent relationship.

Hereinafter, embodiments of the present invention will be described in detail with reference to the accompanying drawings.

FIG. 1 is a schematic cross-sectional view illustrating a white organic light emitting device 100 according to a first embodiment of the present invention.

The white organic light emitting device 100 illustrated in FIG. 1 includes first and second electrodes 102 and 104 and first to third emission parts 110, 120 and 130 between the first and second electrodes 102 and 104. Here, the first and second electrodes 102 and 104 and the first to third emission parts 110, 120 and 130 may be disposed on a substrate 101.

The first electrode 102 is an anode that supplies a hole, and may be formed of gold (Au), silver (Ag), aluminum (Al), molybdenum (Mo), magnesium (Mg), or an alloy thereof. However, the present embodiment is not limited thereto.

The second electrode 104 is a cathode that supplies an electron, and may be formed of indium tin oxide (ITO) or indium zinc oxide (IZO) which is a transparent conductive material such as transparent conductive oxide (TCO). However, the present embodiment is not limited thereto. Alternatively, the second electrode 104 may be formed of gold (Au), silver (Ag), aluminum (Al), molybdenum (Mo), or magnesium (Mg), which is a metal material, or may be formed of an alloy thereof, but the present embodiment is not limited thereto. Alternatively, the second electrode 104 may be formed of two layers which are formed of TCO, ITO, IZO, or IGZO and gold (Au), silver (Ag), aluminum (Al), molybdenum (Mo), or magnesium (Mg) which is a metal material, but the present embodiment is not limited thereto.

Each of the first electrode 102 and the second electrode 104 may be referred to as an anode or a cathode.

The first electrode 102 may be formed as a reflective electrode, and the second electrode 104 may be formed as a semitransmissive electrode.

The first emission part 110 may include a first hole transport layer (HTL) 112, a first emission layer (EML) 114, and a first electron transport layer (ETL) 116 which are disposed on the first electrode 102.

Although not shown, a hole injection layer (HIL) may further be formed on the first electrode 102. The HIL enables a hole, supplied from the first electrode 102, to be smoothly injected. The first HTL 112 may supply a hole, supplied from the HIL, to the first EML 114. The first ETL 116 may supply an electron, supplied from a first charge generation layer (CGL) 140, to the first EML 114.

The HIL may be formed of 4,4',4''-tris(3-methylphenylphenylamino)triphenylamine (MTDATA), copper phthalocyanine (CuPc), poly(3,4-ethylenedioxythiophene, polystyrene sulfonate) (PEDOT/PSS), but is not limited thereto.

A hole supplied through the first HTL 112 and an electron supplied through the first ETL 116 may be recombined in the first EML 114 to emit light.

The first HTL 112 may be formed of two or more layers or two or more materials. The first HTL 112 may be formed one or more of NPD (N,N-bis(naphthalene-1-yl)-N,N'-bis(phenyl)-2,2'-dimethylbenzidine), TPD (N,N'-bis-(3-methylphenyl)-N,N'-bis-(phenyl)-benzidine), and Spiro-TAD (2,2',7,7'-tetrakis(N,N-diphenylamino)-9,9'-spirofluorene), but is not limited thereto.

The first ETL 116 may be formed of two or more layers or two or more materials. The first ETL 116 may be formed one or more of PBD (2-(4-biphenyl)-5-(4-tert-butylphenyl)-1,3,4-oxadiazole), TAZ (3-(4-biphenyl)-4-phenyl-5-tert-butylphenyl-1,2,4-triazole), BAlq (Bis(2-methyl-8-quinolinolate)-4-(phenylphenolato)aluminium), Liq (8-hydroxyquinolinolato-lithium), and TPBi (2,2',2''-(1,3,5-benzinetriyl)-tris(1-phenyl-1-H-benzimidazole), but is not limited thereto.

A hole blocking layer (HBL) may be further formed on the first EML 114. The HBL prevents a hole, injected into the first EML 114, from being transferred to the first ETL 116 and thus enhances recombination of holes and electrons in the first EML 114, thereby enhancing an emission efficiency of the first EML 114. The first ETL 116 and the HBL may be provided as one layer.

An electron blocking layer (EBL) may be further formed under the first EML 114. The EBL prevents an electron, injected into the first EML 114, from being transferred to the first HTL 112 and thus enhances recombination of holes and electrons in the first EML 114, thereby enhancing an emission efficiency of the first EML 114. The first HTL 112 and the EBL may be provided as one layer.

The first EML 114 of the first emission part 110 may be formed as a blue emission layer. The first EML 114 may be formed as a deep blue emission layer or a sky blue emission layer in addition to the blue emission layer. The deep blue emission layer may be disposed in a shorter wavelength range than that the blue emission layer, and thus, a color reproduction rate and luminance are enhanced.

A peak wavelength (λmax) of the first EML 114 may be within a range of 440 nm to 480 nm. Here, the peak wavelength may be an emission area.

The first EML 114 may include an auxiliary emission layer which emits light having a color different from that of light emitted from a blue emission layer. The auxiliary emission layer may be configured with at least one of a yellow-green emission layer, a red emission layer, and a green emission layer, or may be configured by a combination thereof. When the auxiliary emission layer is further provided, an emission efficiency of the green emission layer or the red emission layer can be further improved. When the first EML 114 is provided along with the auxiliary emission layer, the yellow-green emission layer, the red emission layer, or the green emission layer may be disposed on or under the first EML 114.

Moreover, the yellow-green emission layer, the red emission layer, or the green emission layer may be identically or differently provided as the auxiliary emission layer on and under the first EML 114. The positions or number of emission layers may be selectively determined depending on a structure and a characteristic of the device, but the present embodiment is not limited thereto.

A peak wavelength (λmax) of the first EML 114, including a yellow-green emission layer which is the auxiliary emission layer, may be within a range of 440 nm to 590 nm. Here, the peak wavelength may be an emission area. Also, a peak wavelength (λmax) of the first EML 114, including a red emission layer which is the auxiliary emission layer, may be within a range of 440 nm to 650 nm. Here, the peak wavelength may be an emission area. Also, a peak wavelength (λmax) of the first EML 114, including a green emission layer which is the auxiliary emission layer, may be within a range of 440 nm to 570 nm. Here, the peak wavelength may be an emission area.

A host of the first EML 114 may be formed of a single material or may be a mixed host formed of a mixed material. For example, the host of the first EML 114 may be formed of at least one of $Alq_3$ (tris(8-hydroxy-quinolino)aluminum), AND (9,10-di(naphtha-2-yl)anthracene), BSBF (2-(9,9-spirofluoren-2-yl)-9,9-spirofluorene) or may be formed of a material which is selected by mixing two or more materials, but is not limited thereto.

A dopant of the first EML 114 may be formed of a pyrene-based material. In more detail, the dopant of the first EML 114 may be formed of a pyrene-based compound which is substituted with an arylamine-based compound, but is not limited thereto.

The second emission part 120 may include a second HTL 122, a second EML 124, and a second ETL 126.

Although not shown, in the second emission part 120, an electron injection layer (EIL) may be further formed on the second ETL 126. Also, the second emission part 120 may further include an HIL.

The second HTL 122 may be formed of the same material as that of the first HTL 112, but is not limited thereto.

The second HTL 122 may be formed of two or more layers or two or more materials.

The second ETL 126 may be formed of the same material as that of the first ETL 116, but is not limited thereto.

The second ETL 126 may be formed of two or more layers or two or more materials.

An HBL may be further formed on the second EML 124. The HBL prevents a hole, injected into the second EML 124, from being transferred to the second ETL 126 and thus enhances recombination of holes and electrons in the second EML 124, thereby enhancing an emission efficiency of the second EML 124. The second ETL 126 and the HBL may be provided as one layer.

An EBL may be further formed under the second EML 124. The EBL prevents an electron, injected into the second EML 124, from being transferred to the second HTL 122 and thus enhances recombination of holes and electrons in the second EML 124, thereby enhancing an emission efficiency of the second EML 124. The second HTL 122 and the EBL may be provided as one layer.

The second EML 124 of the second emission part 120 may be formed as a blue emission layer. The second EML 124 may be formed as a deep blue emission layer or a sky blue emission layer in addition to the blue emission layer. The deep blue emission layer may be disposed in a shorter wavelength range than that of the blue emission layer, and thus, a color reproduction rate and luminance are enhanced.

An peak wavelength ($\lambda$max) of the second EML 124 may be within a range of 440 nm to 480 nm. Here, the peak wavelength may be an emission area.

The second EML 124 may include an auxiliary emission layer which emits light having a color different from light emitted from a blue emission layer. The auxiliary emission layer may be configured with at least one of a yellow-green emission layer, a red emission layer, and a green emission layer, or may be configured by a combination thereof. When the auxiliary emission layer is further provided, an emission efficiency of the green emission layer or the red emission layer can be further improved. When the second EML 124 is provided along with the auxiliary emission layer, the yellow-green emission layer, the red emission layer, or the green emission layer may be disposed on or under the second EML 124.

Moreover, the yellow-green emission layer, the red emission layer, or the green emission layer may be identically or differently provided as the auxiliary emission layer on and under the second EML 124. The positions or number of emission layers may be selectively determined depending on a structure and a characteristic of a device, but the present embodiment is not limited thereto.

A peak wavelength ($\lambda$max) of the second EML 124, including a yellow-green emission layer which is the auxiliary emission layer, may be within a range of 440 nm to 590 nm. Here, the peak wavelength may be an emission area. Also, a peak wavelength ($\lambda$max) of the second EML 124, including a red emission layer which is the auxiliary emission layer, may be within a range of 440 nm to 650 nm. Here, the peak wavelength may be an emission area. Also, a peak wavelength ($\lambda$max) of the second EML 124, including a green emission layer which is the auxiliary emission layer, may be within a range of 440 nm to 570 nm. Here, the peak wavelength may be an emission area.

The second EML 124 may be formed of the same material as that of the first EML 114, but is not limited thereto.

A host of the second EML 124 may be formed of a single material or may be a mixed host formed of a mixed material. For example, the host of the second EML 124 may be formed of at least one of $Alq_3$ (tris(8-hydroxy-quinolino) aluminum), AND (9,10-di(naphtha-2-yl)anthracene), BSBF (2-(9,9-spirofluoren-2-yl)-9,9-spirofluorene) or may be formed of a material which is selected by mixing two or more materials, but is not limited thereto.

A dopant of the second EML 124 may be formed of a pyrene-based material. In more detail, the dopant of the first EML 114 may be formed of a pyrene-based compound which is substituted with an arylamine-based compound, but is not limited thereto.

A first charge generation layer (CGL) 140 may be further formed between the first emission part 110 and the second emission part 120. The first CGL 140 may adjust a balance of charges between the first emission part 110 and the second emission part 120. The first CGL 140 may include an N-type CGL or a P-type CGL.

The N-type CGL may be formed as an organic layer on which alkali metal such as lithium (Li), sodium (Na), potassium (K), or cesium (Cs) or alkali earth metal such as magnesium (Mg), strontium (Sr), barium (Ba), or radium (Ra) are used as dopants, but is not limited thereto.

The P-type CGL may be formed as an organic layer including a P-type dopant, but is not limited thereto.

The first CGL 140 may be formed of a single layer.

The third emission part 130 may include a third ETL 136, a third EML 134, and a third HTL 132 which are disposed under the second electrode 104.

Although not shown, the third emission part 130 may further include an EIL which is disposed on the third ETL 136. Also, the third emission part 130 may further include an HIL.

The third HTL 132 may be formed of TPD (N,N'-bis(3-methylphenyl)-N,N'-bis(phenyl)-benzidine) or NPB (N,N-bis(naphthalen-1-yl)-N,N'-bis(phenyl)-benzidine), but is not limited thereto.

The third HTL 132 may be formed of two or more layers or two or more materials.

The third ETL 136 may be formed of oxadiazole, phenanthroline, benzoxazole, or benzthiazole, but is not limited thereto.

The third ETL 136 may be formed of two or more layers or two or more materials.

An HBL may be further formed on the third EML 134. The HBL prevents a hole, injected into the third EML 134, from being transferred to the third ETL 136 and thus enhances recombination of holes and electrons in the third EML 134, thereby enhancing an emission efficiency of the third EML 134. The third ETL 136 and the HBL may be provided as one layer.

An EBL may be further formed under the third EML 134. The EBL prevents an electron, injected into the third EML 134, from being transferred to the third HTL 132 and thus enhances recombination of holes and electrons in the third EML 134, thereby enhancing an emission efficiency of the third EML 134. The third HTL 132 and the EBL may be provided as one layer.

A second CGL 150 may further be formed between the second emission part 120 and the third emission part 130. The second CGL 150 may adjust a balance of charges between the second emission part 120 and the third emission part 130. The second CGL 150 may include an N-type CGL or a P-type CGL.

The N-type CGL may inject an electron into the second emission part 120, and the P-type CGL may inject a hole into the third emission part 130.

The N-type CGL may be formed as an organic layer on which alkali metal such as lithium (Li), sodium (Na), potassium (K), or cesium (Cs) or alkali earth metal such as magnesium (Mg), strontium (Sr), barium (Ba), or radium (Ra) are used as dopants, but is not limited thereto.

The P-type CGL may be formed as an organic layer including a P-type dopant, but is not limited thereto. The first CGL 140 may be formed of the same material as that of the N-CGL and the P-CGL of the second CGL 150, but is not limited thereto.

The second CGL 150 may be formed of a single layer.

The third EML 134 of the third emission part 130 may be formed as at least one of a yellow-green emission layer, a green emission layer, a yellow emission layer and a red emission layer, a red emission layer and a green emission layer, and a yellow-green emission layer and a red emission layer, or may be configured by a combination thereof.

A host of the third EML 134 may be formed of a single material or may be a mixed host formed of a mixed material. For example, the host of the third EML 134 may be formed of at least one of CBP (4,4'-bis(carbazol-9-yl)biphenyl), spiro-CBP (2,2',7,7'-tetrakis(carbazol-9-yl)-9,9'-spirobifluorene), and TcTa (4,4',4''-tris(carbazoyl-9-yl)triphenylamine), but is not limited thereto.

A dopant of the third EML 134 may be formed of an iridium-based compound, but is not limited thereto.

The white organic light emitting device according to the present embodiment has been described above as being applied to a bottom emission type, but is not limited thereto. The white organic light emitting device according to the present embodiment may be applied to a top emission type or a dual emission type. In the top emission type or the dual emission type, a whole thickness of a device or positions of emission layers may be changed based on a characteristic of a device.

Although not shown, in an organic light emitting display apparatus including the white organic light emitting device according to the present embodiment, a plurality of gate lines and a plurality of data lines which respectively define a plurality of pixel areas by intersecting therebetween and a plurality of power lines which extend in parallel with the gate lines or the data lines may be disposed on the substrate 101 and a switching thin film transistor (TFT) which is connected to a corresponding gate line and a corresponding data line and a driving TFT connected to the switching TFT may be disposed in each of the plurality of pixel areas. The driving TFT may be connected to the first electrode 102.

In the present invention, an emission position of an emission layer configuring each of the first to third EMLs 114, 124 and 134 is optimized for enhancing red efficiency, green efficiency, blue efficiency, emission efficiency, and a color viewing angle or a color reproduction rate. This will be described in detail with reference to FIG. 2.

Figure 2:
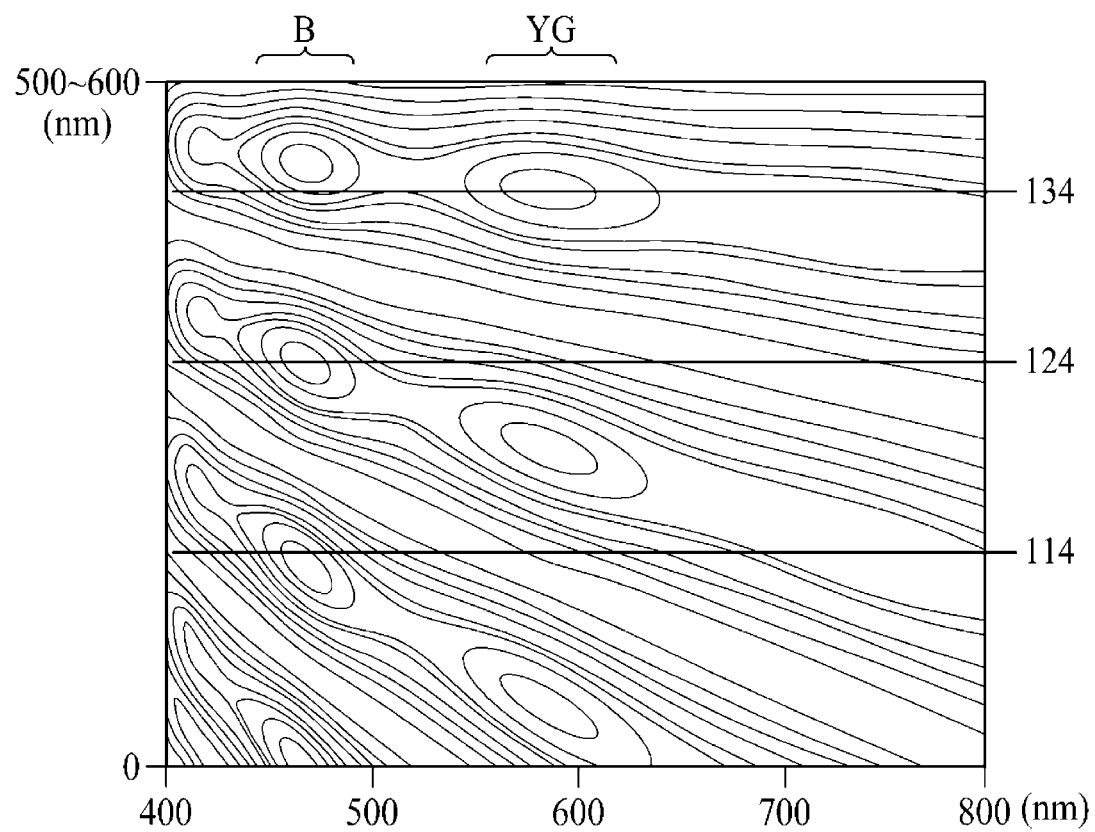
FIG. 2 is a diagram illustrating an emission position of an organic light emitting device according to a first embodiment of the present invention.

FIG. 2 is a diagram illustrating an emission position of the white organic light emitting device according to the first embodiment of the present invention.

In FIG. 2, the abscissa axis indicates a wavelength range of light, and the ordinate axis indicates a thickness of organic layers. The organic layers denote layers configuring the first to third emission parts 110, 120 and 130. In FIG. 2, a thickness of the organic layers configuring the first to third emission parts 110, 120 and 130 is not illustrated.

As illustrated in FIG. 2, each of the first EML 114 configured in the first emission part 110 and the second EML 124 configured in the second emission part 120 may be a blue emission layer, and a peak wavelength of the blue emission layer may be 440 nm to 480 nm. An area corresponding to a peak wavelength of each of the first and second EMLs 114 and 124 is referred to by B in FIG. 2.

Moreover, the third EML 134 configuring the third emission part 130 may be a yellow-green emission layer, and a peak wavelength of the yellow-green emission layer may be 540 nm to 575 nm. An area corresponding to a peak wavelength of the third EML 134 is referred to by YG in FIG. 2.

For the first blue emission position (i.e., peak wavelength of 440 nm-480 nm), the maximum efficiency is obtained at the first EML 114. The maximum efficiency for the second blue emission position (i.e., peak wavelength of 440 nm-480 nm) is at the second EML 124. As for the yellow-green emission position (i.e., peak wavelength of 540 nm~575 nm), the maximum efficiency is obtained at the third EML 134. Therefore, it can be seen that when emission positions of emission layers according to the present embodiment are adjusted to correspond to peak wavelengths of the emission layers, the EML, as a whole, can emit white light at its maximum efficiency. Also, since an emission efficiency of an emission layer increases, panel efficiency, a color reproduction rate, or a color viewing angle is enhanced.

Here, a peak wavelength ($\lambda$max) denotes a maximum wavelength of electroluminescence (EL). A wavelength where each of organic material layers configuring an emission part emits unique light is referred to as photoluminescence (PL), and light which is emitted by an influence of a cavity peak (which is an optical characteristic) on the PL is referred to as EL. Also, the cavity peak denotes a point where a transmittance is optically the maximum, and is for finding a point or a portion where a wavelength of light emitted between two mirrors is the maximum through constructive interference of the wavelength of the light by adjusting an emission position of an emission area in the two mirrors (corresponding to a portion where the light is reflected by the second electrode in the present invention). Also, in the cavity peak, an emission peak may be changed depending on a total thickness of an organic light emitting device, PLs of organic material layers, and a thickness of the first electrode.

Therefore, in the present invention, the order of emission layers or emission positions of the emission layers may be adjusted in consideration of a spectrum change rate and a cavity peak of each of the emission layers. That is, the order or emission positions of the first EML, the second EML, and the third EML may be adjusted in consideration of a spectrum change rate and a cavity peak of each of the first EML, the second EML, and the third EML. An experimental result will be described in detail with reference to FIGS. 3 to 6 and Table 1. FIGS. 3 to 6 and Table 1 show results when a device is configured in the bottom emission type.

Figure 3:
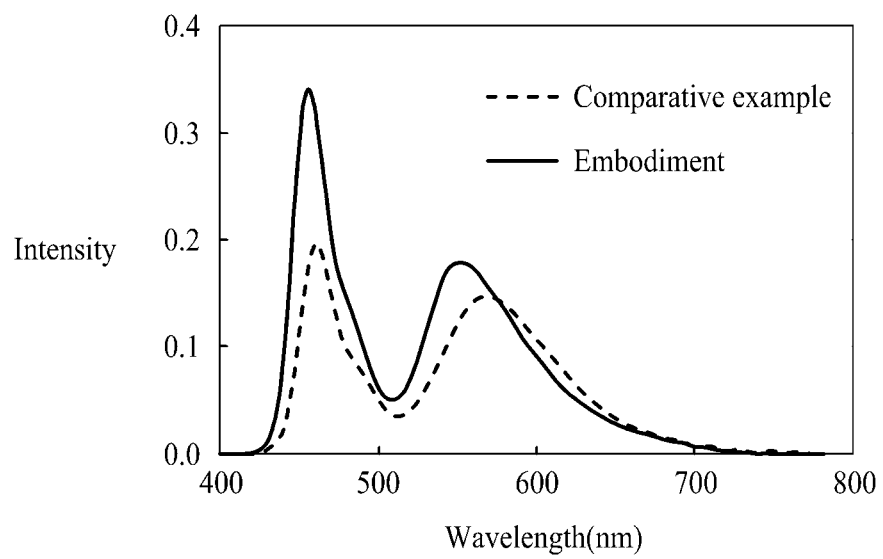
FIG. 3 is a diagram illustrating an electroluminescence (EL) spectrum of a comparative example and an EL spectrum according to a first embodiment of the present invention.

FIG. 3 is a diagram illustrating an emission intensity of a comparative example and emission intensity according to a first embodiment of the present invention. FIG. 3 may show an EL spectrum. The emission intensity may be a numerical value which is expressed as a relative value with respect to a maximum value of the EL spectrum.

Figure 5:
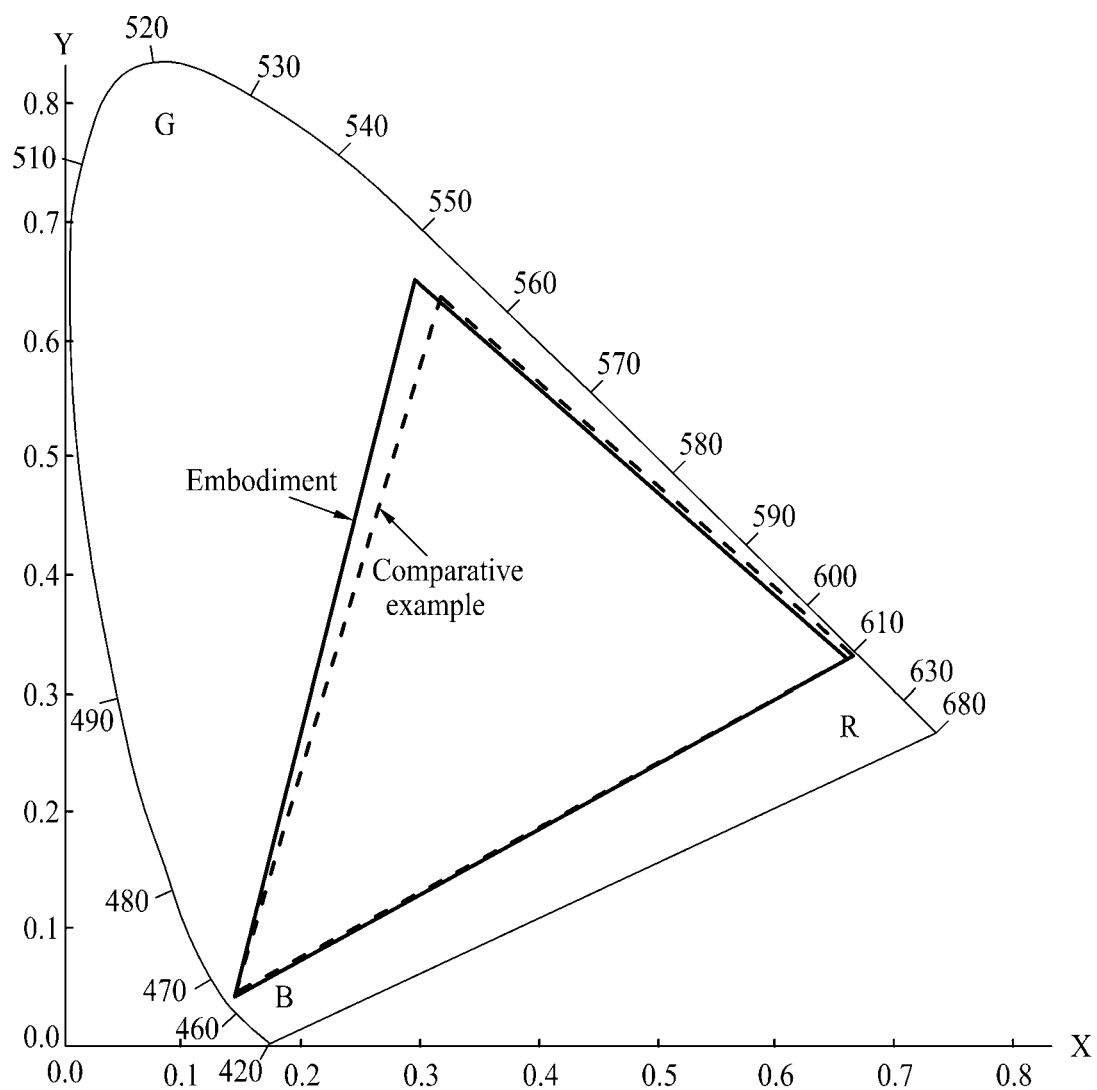
FIG. 5 is a diagram illustrating color coordinates of a comparative example and color coordinates according to a first embodiment of the present invention.
Figure 6:
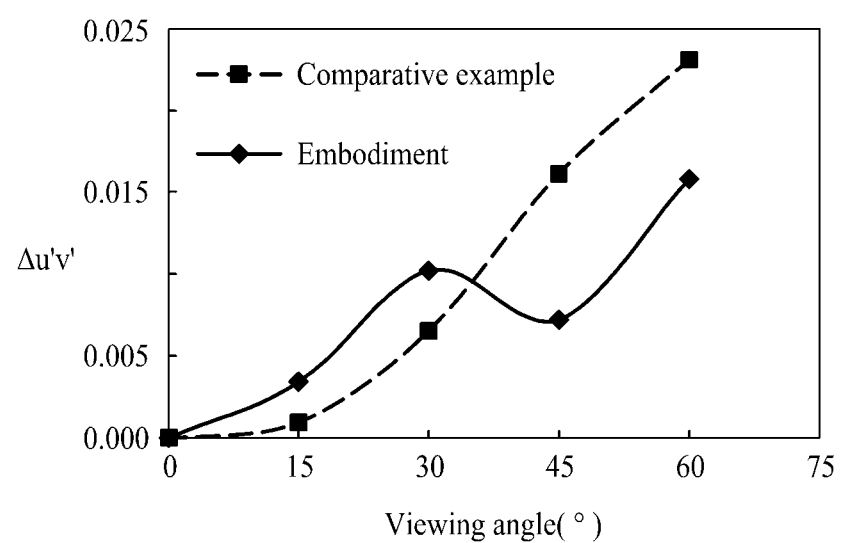
FIG. 6 is a diagram illustrating a color viewing angle of a comparative example and a color viewing angle according to a first embodiment of the present invention.

As illustrated in FIGS. 3, 5 and 6, in the comparative example, two emission parts where a first EML is formed as a blue emission layer and a second EML is formed as a yellow-green emission layer may be provided. In an embodiment, as illustrated in FIG. 1, three emission parts where each of a first EML and a second EML is formed as a blue emission layer and a third EML is formed as a yellow-green emission layer may be provided. The emission parts may include an ETL and an HTL. A CGL may be provided between the two emission parts or between the three emission parts.

In FIG. 3, a solid line refers to the embodiment, and a dot line refers to the comparative example.

As illustrated in FIG. 3, in the comparative example and the first embodiment of the present invention, it can be seen that a peak wavelength ($\lambda$max) of blue is shown at 440 nm to 480 nm. In comparison with the comparative example, it can be seen that in the first embodiment of the present invention, emission intensity further increases at 440 nm to 480 nm which is a peak wavelength (λmax) of blue.

In the comparative example, it can be seen that a peak wavelength (λmax) of yellow-green is shown at 530 nm to 590 nm. In comparison with the comparative example, it can be seen that in the first embodiment of the present invention, a peak wavelength range is moved to the left. That is, it can be seen that a peak wavelength (λmax) of yellow-green is shown at 540 nm to 575 nm. Also, in comparison with the comparative example, it can be seen that in the first embodiment of the present invention, an emission intensity of yellow-green further increases.

An undesired emission area increases because yellow-green light is emitted at 530 nm to 590 nm in the comparative example, and thus, an emission intensity of the comparative example is lower than that of the first embodiment. In the comparative example, emission intensity is low, and thus, an emission efficiency of yellow-green is lowered. Therefore, a color reproduction rate and a color viewing angle based on a viewing angle caused by an efficiency difference between emission colors are lowered.

Moreover, in comparison with the comparative example, it can be seen that in the first embodiment of the present invention, an emission intensity of yellow-green increases. A peak wavelength of a yellow-green emission layer may be within a range of 540 nm to 575 nm in consideration of a spectrum change rate based on a viewing angle and a cavity peak of yellow-green, and thus, an undesired emission area decreases, thereby increasing emission intensity. Therefore, green efficiency increases, and thus, an emission efficiency of the yellow-green emission layer increases. Accordingly, a color reproduction rate and a color viewing angle based on a viewing angle caused by an efficiency difference between emission colors are enhanced.

Moreover, since two emission layers are each formed as a blue emission layer in the three emission parts, an emission efficiency of the blue emission layer increases. That is, an emission intensity of the blue emission layer increases in comparison with the comparative example, and thus, an emission efficiency of the blue emission layer increases. Accordingly, a color reproduction rate and a color viewing angle "Δu'v'" based on a viewing angle caused by an efficiency difference between emission colors are enhanced.

A spectrum change rate based on a viewing angle of an emission layer will be described in detail with reference to FIG. 4.

Figure 4:
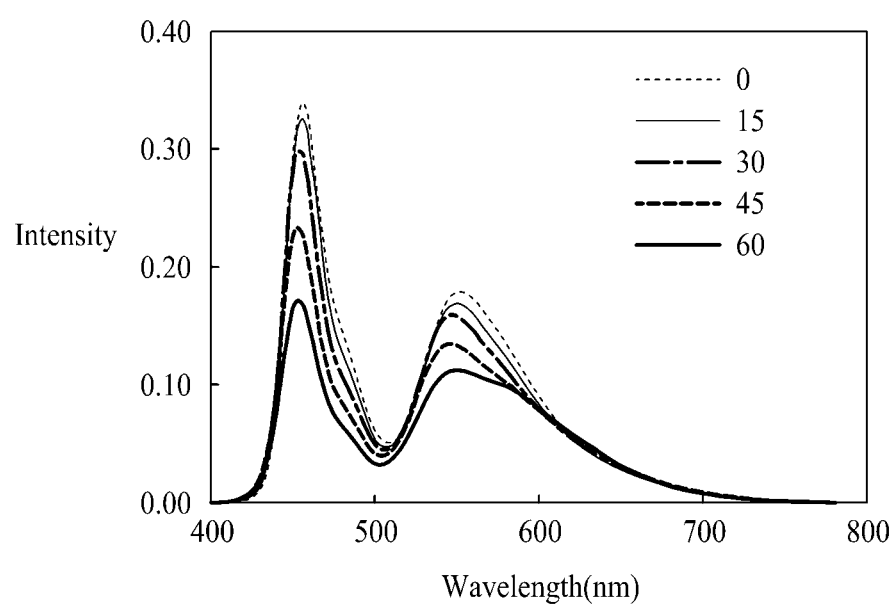
FIG. 4 is a graph showing a spectrum change rate based on a viewing angle according to a first embodiment of the present invention.

FIG. 4 is a diagram showing a spectrum change rate based on a viewing angle according to a first embodiment of the present invention.

In FIG. 4, emission intensity has been measured at 0 degree, 15 degrees, 30 degrees, 45 degrees, and 60 degrees while looking at a device from the front to the side portion. The emission intensity may be a numerical value which is expressed as a relative value with respect to a maximum value of the EL spectrum.

When two emission parts which each include two emission layers (for example, a blue emission layer and a yellow-green emission layer) are provided, a spectrum change rate based on a viewing angle of each of the blue emission layer and the yellow-green emission layer may be changed depending on a cavity peak difference. In a spectrum change rate based on a viewing angle of the blue emission layer, emission intensity is largely reduced depending on a viewing angle, but in a spectrum change rate based on a viewing angle of the yellow-green emission layer, emission intensity is slowly reduced depending on a viewing angle, whereby a viewing angle characteristic of the yellow-green emission layer is degraded. Therefore, a spectrum change rate of blue and a spectrum change rate of yellow-green may be adjusted for improving a viewing angle characteristic. A cavity peak of yellow-green may be adjusted to a position deviating from a desired position, and for this reason, red efficiency, green efficiency, and blue efficiency are reduced.

According to the present embodiment, two blue emission layers which respectively emit lights having the same color may be adjacent to each other in three emission parts so as to adjust a spectrum change rate of blue and yellow-green layers. The blue emission layers may have two blue spectrums, and thus, it is useful to adjust a spectrum change rate of yellow-green based on the two blue spectrums. That is, a cavity peak of the yellow-green emission layer may be located at a desired position based on the two blue emission layers.

Moreover, since the two blue emission layers are provided, a spectrum change rate of blue and a spectrum change rate of yellow-green are almost similar in difference, and thus, a color viewing angle is enhanced. Here, the spectrum change rate may be referred to as a spectrum change rate based on a viewing angle. Also, the spectrum change rate may be referred to as an emission intensity change rate based on a viewing angle.

Moreover, since the two blue emission layers are adjacent to each other, a spectrum change rate of blue and a spectrum change rate of yellow-green are almost similar in difference, and thus, a cavity peak of the blue emission layer and a cavity peak of the yellow-green emission layer may be located in an emission area. Here, the spectrum change rate may be referred to as a spectrum change rate based on a viewing angle. Also, the spectrum change rate may be referred to as an emission intensity change rate based on a viewing angle.

As illustrated in FIG. 4, it can be seen that a spectrum change rate based on a viewing angle of the blue emission layer and a spectrum change rate based on a viewing angle of the yellow-green emission layer are almost similar, namely, an emission intensity change rate based on a viewing angle of the blue emission layer and an emission intensity change rate based on a viewing angle of the yellow-green emission layer are almost similar. Therefore, when a spectrum change rate based on a viewing angle is low, an emission intensity change rate based on a viewing angle is low, and thus, a visual characteristic of a specific color based on a viewing angle is not degraded. Therefore, a color viewing angle or a change in color coordinates based on a viewing angle is reduced. Also, since a spectrum change rate based on a viewing angle is low, a viewing angle characteristic is enhanced.

Moreover, a spectrum change rate based on a viewing angle of the blue emission layer and a spectrum change rate based on a viewing angle of the yellow-green emission layer are almost similar, and thus, a cavity peak of the blue emission layer and a cavity peak of the yellow-green emission layer may be located in a desired emission area. Here, the spectrum change rate may be referred to as a spectrum change rate based on a viewing angle. Also, the spectrum change rate may be referred to as an emission intensity change rate based on a viewing angle.

Therefore, due to the blue emission layers which are the two emission layers emitting lights having the same color, a cavity peak of the yellow-green emission layer emitting light having a color different from that of the light emitted from the blue emission layer and a cavity peak of each of the blue emission layers emitting the lights having the same color may be located in an emission area.

When a peak wavelength (λmax) corresponding to an emission area of each of the two blue emission layers 114 and 124 may be 440 nm to 480 nm and a peak wavelength (λmax) corresponding to an emission area of the yellow-green emission layers 134 may be 440 nm to 480 nm, an emission layer may emit light in a desired emission area, and thus, an undesired emission area is minimized. Also, a peak wavelength (λmax) of the yellow-green emission layer may be within a range of 540 nm to 575 nm, and an undesired emission area of the yellow-green emission layer which is the third EML 134 is reduced at the peak wavelength (λmax). Also, a problem is solved where when a peak wavelength (λmax) of the blue emission layer is shifted to the right or a peak wavelength (λmax) of the yellow-green emission layer is shifted to the left side, and a blue efficiency and green efficiency are lowered, and a color reproduction rate or a color viewing angle is lowered.

Therefore, since each emission layer emits light in a desired emission area, an emission efficiency of each emission layer is enhanced, and panel efficiency and a color reproduction rate or a color viewing angle are enhanced.

As described above, an emission intensity of the blue emission layer and an emission intensity of the yellow-green emission layer increase, and thus, an emission efficiency of each emission layer increases. Also, a color reproduction rate and a color viewing angle "Δu'v'" based on a viewing angle are enhanced. This will be described in detail with reference to Table 1 and FIGS. 5 and 6.

The following Table 1 shows a result obtained by measuring efficiencies and panel efficiencies according to the comparative example and the first embodiment of the present invention.

TABLE 1

| Division | Red Efficiency (cd/A) | Green Efficiency (cd/A) | Blue Efficiency (cd/A) | White Efficiency (cd/A) | Panel Efficiency (cd/A) |
|---|---|---|---|---|---|
| Comparative Example | 8.0 | 29.9 | 2.2 | 72.9 | 22.9 |
| Embodiment | 7.0 | 38.7 | 3.5 | 85.8 | 35.5 |

Referring to Table 1, in the comparative example, two emission parts where the first EML is formed as the blue emission layer and the second EML is formed as the yellow-green emission layer are provided. In the embodiment, as illustrated in FIG. 1, three emission parts where each of the first and second EMLs is formed as the blue emission layer and the third EML is formed as the yellow-green emission layer are provided. As described above, each of the emission parts may include an ETL and an HTL, and a CGL may be provided between the two emission parts or the three emission parts.

Referring to red efficiency, green efficiency, blue efficiency, and white efficiency, the red efficiency has been measured as 8.0 cd/A in the comparative example, and in the embodiment, the red efficiency has been measured as 7.0 cd/A. It has been measured that the red efficiency of the comparative example is similar to the red efficiency of the embodiment.

Moreover, the green efficiency has been measured as 29.9 cd/A in the comparative example, and in the embodiment, the green efficiency has been measured as 38.7 cd/A. Therefore, as illustrated in FIG. 2, it can be seen that since the yellow-green emission layer is disposed in a desired peak wavelength range, the green efficiency is enhanced by 29% in comparison with the comparative example. Since the green efficiency increases, an emission efficiency of the yellow-green emission layer increases.

Moreover, the blue efficiency has been measured as 2.2 cd/A in the comparative example, and in the embodiment, the blue efficiency has been measured as 3.5 cd/A. Therefore, it can be seen that since each of the first and second EMLs is formed as the blue emission layer, the blue efficiency is enhanced by 59% in comparison with the comparative example. Since the blue efficiency increases, an emission efficiency of the blue emission layer increases.

Moreover, the white efficiency has been measured as 72.9 cd/A in the comparative example, and in the embodiment, the white efficiency has been measured as 85.8 cd/A. Therefore, it can be seen that since each of the first and second EMLs is formed as the blue emission layer, the white efficiency is enhanced by 18% in comparison with the comparative example.

Moreover, the panel efficiency has been measured as 22.9 cd/A in the comparative example, and in the embodiment, the panel efficiency has been measured as 35.5 cd/A. Therefore, it can be seen that the panel efficiency is enhanced by 55% in comparison with the comparative example.

FIG. 5 is a diagram illustrating color coordinates of a comparative example and color coordinates according to a first embodiment of the present invention. The color coordinates have been measured based on the national television system committee (NTSC) standard.

The color coordinates will be described as follows. Red has been measured as (0.665, 0.330) in a comparative example, and in an embodiment, red has been measured as (0.661, 0.329). Green has been measured as (0.317, 0.635) in the comparative example, and in the embodiment, green has been measured as (0.295, 0.649). Blue has been measured as (0.142, 0.046) in the comparative example, and in the embodiment, blue has been measured as (0.143, 0.043). White has been measured as (0.337, 0.338) in the comparative example, and in the embodiment, white has been measured as (0.285, 0.300). Through such a result, it can be seen that a color reproduction rate increases from 81.7% to 85.5% in comparison with the comparative example. Also, green is located in a short wavelength range in comparison with the comparative example, and thus, it can be seen that a broader color coordinate range than that of the comparative example is provided due to a color coordinate change of green, and thus, a color reproduction rate is enhanced.

FIG. 6 is a graph showing a color viewing angle "Δu'v'" based on a viewing angle. As illustrated in FIG. 6, the color viewing angle has been measured at 0 degrees, 15 degrees, 30 degrees, 45 degrees, and 60 degrees while looking at a device from the front to the side portion. In FIG. 6, a solid line refers to an embodiment, and a dot line refers to a comparative example.

When a viewing angle of light emitted from an organic light emitting device is 60 degrees, it can be seen that the color viewing angle "Δu'v'" is 0.023 in the comparative example, and in an embodiment, the color viewing angle "Δu'v'" is 0.016. In the embodiment, since the color viewing angle "Δu'v'" based on a viewing angle is small, a color change rate felt by a user is improved depending on a viewing angle. Also, a color viewing angle "Δu'v'" of white decreases, and thus, when an organic light emitting display apparatus is implemented, the same color is easily realized irrespective of a viewing-angle position.

In the present invention, the order of emission layers or emission positions of the emission layers may be adjusted in consideration of a spectrum change rate and a cavity peak of each of the emission layers. That is, the order or emission positions of the first EML, the second EML, and the third EML may be adjusted in consideration of a spectrum change rate and a cavity peak of each of the first EML, the second EML, and the third EML. Therefore, two emission layers emitting lights having the same color may be closer to the first electrode 102 than the second electrode 104, and an emission layer emitting light having a color different from those of the lights may be closer to the second electrode 104 than the first electrode 102. Also, the blue emission layers of the first and second EMLs 114 and 124 may be closer to the first electrode 102 than the second electrode 104, and thus, an emission intensity of the blue emission layer increases, thereby enhancing an emission efficiency of the blue emission layer, panel efficiency, and a color reproduction rate or a color viewing angle. Also, if the two blue emission layers are closer to the first electrode 102 than the second electrode 104, red efficiency further increases than a case (referred to as a comparative 1) where the two blue emission layers are closer to the second electrode 104 than the first electrode 102. This will be described in detail with reference to Table 2 and FIGS. 7 and 8.

In the comparative example 1, three emission parts where a first EML is formed as a yellow-green emission layer and each of second and third EMLs is formed as a blue emission layer may be provided. In an embodiment, three emission parts where each of a first EML and a second EML is formed as a blue emission layer and a third EML is formed as a yellow-green emission layer may be provided. The emission parts may include an ETL and an HTL. A CGL may be provided between the three emission parts.

TABLE 2

| Division | Red Efficiency (cd/A) | Green Efficiency (cd/A) | Blue Efficiency (cd/A) | White Efficiency (cd/A) | Panel Efficiency (cd/A) |
|---|---|---|---|---|---|
| Comparative Example 1 | 3.7 | 44.2 | 4.2 | 82.7 | 16.3 |
| Embodiment | 7.0 | 44.3 | 4.5 | 87.7 | 30.8 |

As shown in Table 2, it can be seen that a red efficiency of the comparative example 1 is 3.7 cd/A, and a red efficiency of an embodiment is 7.0 cd/A. Therefore, it can be seen that the red efficiency of the embodiment increases by about 90% in comparison with the comparative example 1. Also, it can be seen that a green efficiency of the comparative example 1 is 44.2 cd/A, a green efficiency of the embodiment is 44.3 cd/A, and the green efficiency of the comparative example 1 is almost similar to the green efficiency of the embodiment. Also, it can be seen that a blue efficiency of the comparative example 1 is 4.2 cd/A, a blue efficiency of the embodiment is 4.5 cd/A, and the blue efficiency of the embodiment increases by 7% in comparison with the blue efficiency of the comparative example 1. Also, it can be seen that a white efficiency of the comparative example 1 is 82.7 cd/A, a white efficiency of the embodiment is 87.7 cd/A, and the white efficiency of the embodiment increases by about 6% in comparison with the white efficiency of the comparative example 1.

In the panel efficiency, the comparative example 1 is 16.3 cd/A, and the embodiment is 30.8 cd/A. Therefore, it can be seen that the embodiment increases by about 89% in comparison with the comparative example 1.

Accordingly, when the two blue emission layers are closer to the first electrode 102 than the second electrode 104, it can be seen that the red efficiency, the blue efficiency, the white efficiency, and the panel efficiency increase. In particular, it can be seen that the red efficiency increases far more.

Figure 7:
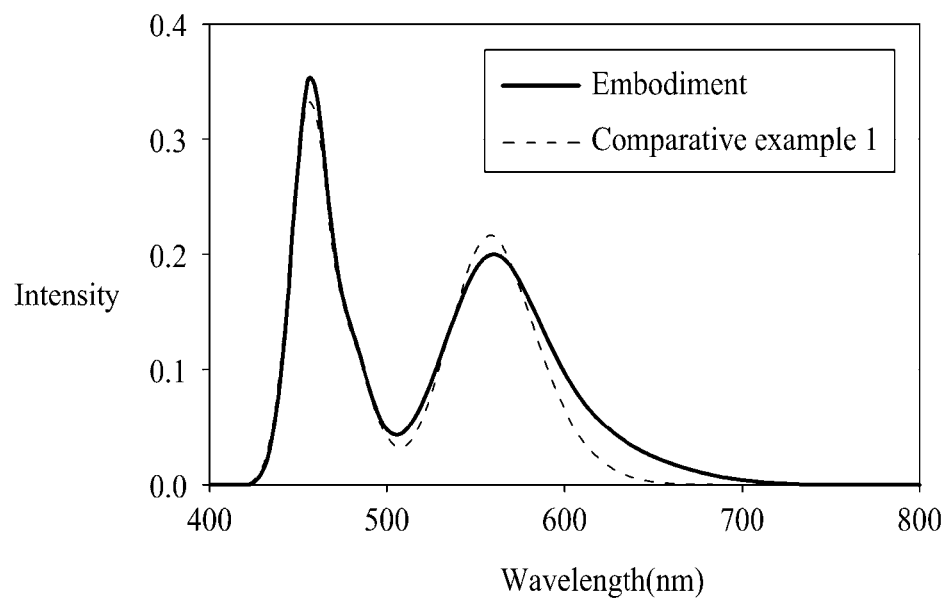
FIG. 7 is a diagram illustrating an EL spectrum of a comparative example 1 and an EL spectrum according to a first embodiment of the present invention.

FIG. 7 is a diagram illustrating an emission intensity of a comparative example 1 and emission intensity according to a first embodiment of the present invention. FIG. 7 may show an EL spectrum. The emission intensity may be a numerical value which is expressed as a relative value with respect to a maximum value of the EL spectrum. In FIG. 7, the comparative example 1 is illustrated as a dot line, and an embodiment is illustrated as a solid line.

As illustrated in FIG. 7, in the comparative example 1 and the embodiment, it can be seen that a peak wavelength (λmax) of blue is shown at 440 nm to 480 nm. It can be seen that the emission intensity of the embodiment further increases than the comparative example 1 at 440 nm to 480 nm which is the peak wavelength (λmax) of blue.

In the comparative example 1, it can be seen that a peak wavelength (λmax) of yellow-green is shown at 530 nm to 590 nm. In the embodiment, it can be seen that a peak wavelength (λmax) of yellow-green is shown at 540 nm to 575 nm. It can be seen that an emission intensity of yellow-green of the embodiment is similar to an emission intensity of yellow-green of the comparative example 1.

Moreover, in the comparative example 1 and the embodiment, it can be seen that a peak wavelength (λmax) of red is shown at 600 nm to 650 nm. It can be seen that the emission intensity of the embodiment further increases than the comparative example 1 at 600 nm to 650 nm which is the peak wavelength (λmax) of red.

A color viewing angle "Δu'v'" based on a viewing angle will be described in detail with reference to FIG. 8.

Figure 8:
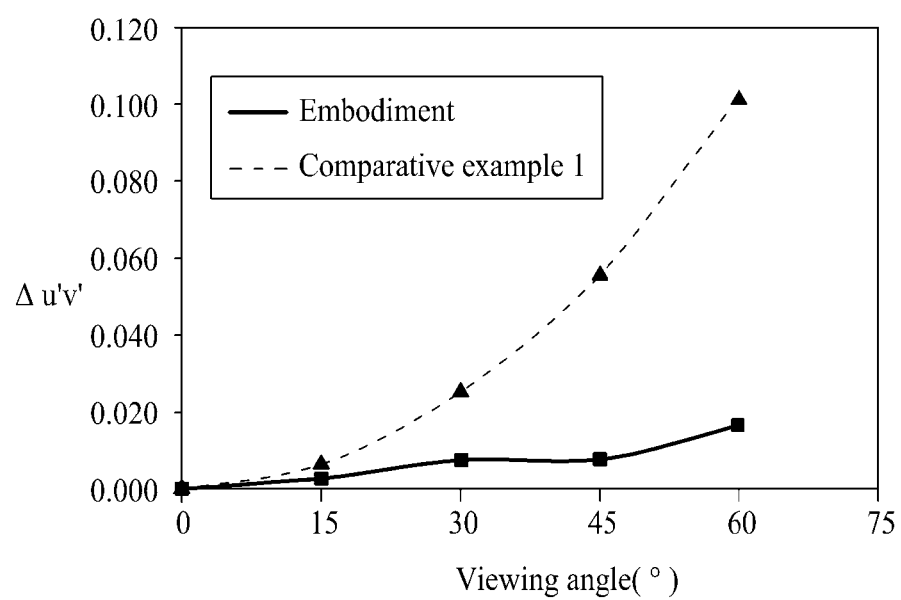
FIG. 8 is a diagram illustrating a color viewing angle of a comparative example 1 and a color viewing angle according to a first embodiment of the present invention.

FIG. 8 is a graph showing a color viewing angle "Δu'v'" based on a viewing angle. As illustrated in FIG. 8, the color viewing angle has been measured at 0 degrees, 15 degrees, 30 degrees, 45 degrees, and 60 degrees while looking at a device from the front to the side portion. In FIG. 8, a comparative example 1 is illustrated as a dot line, and an embodiment is illustrated as a solid line.

When a viewing angle of light emitted from an organic light emitting device is 60 degrees, it can be seen that the color viewing angle "Δu'v'" is 0.100 in the comparative example 1, and in the embodiment, the color viewing angle "Δu'v'" is 0.016. In the embodiment, since the color viewing angle "Δu'v'" based on a viewing angle is small, a color change rate felt by a user is improved depending on a viewing angle. Also, a color viewing angle "Δu'v'" of white decreases, and thus, when an organic light emitting display apparatus is implemented, the same color is easily realized irrespective of a viewing-angle position.

Accordingly, when the two blue emission layers are disposed closer to the first electrode 102 than the second electrode 104, an emission intensity of red increases, and thus, a color reproduction rate and a color viewing angle based on a viewing angle caused by an efficiency difference between emission colors are improved.

However, when an organic light emitting device is designed, a structure of the comparative example 1 may be applied as a structure for increasing red efficiency.

In the present embodiment, three emission parts have been described above as an example. However, three or more emission parts may be provided, and at least two of the three or more emission parts may respectively emit lights having the same color. Two emission parts which respectively emit lights having the same color may be disposed closer to the first electrode 102 than the second electrode 104, thereby enhancing an emission efficiency of the blue emission layer, panel efficiency, and a color reproduction rate or a color viewing angle based on a viewing angle.

Figure 9:
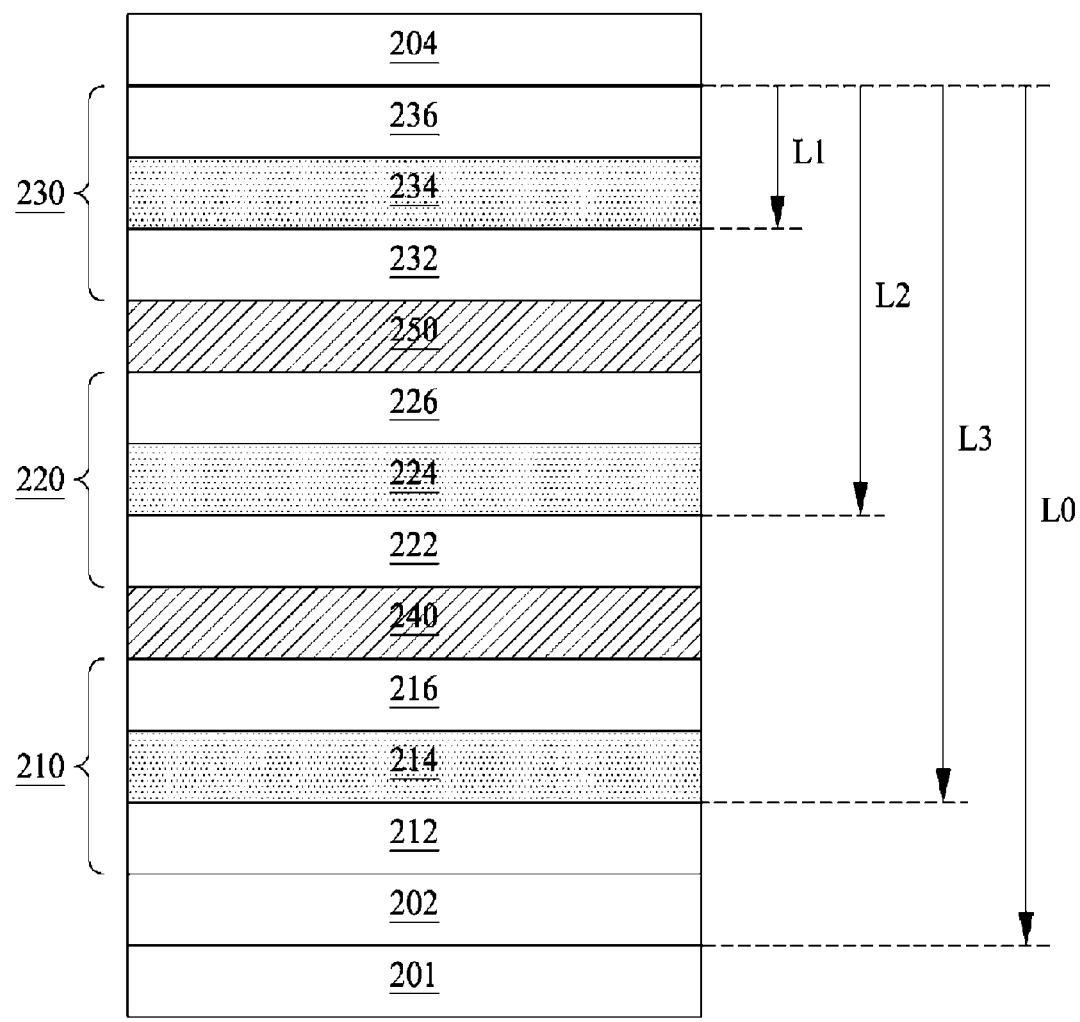
FIG. 9 is a schematic cross-sectional view illustrating a white organic light emitting device according to a second embodiment of the present invention.

FIG. 9 is a schematic cross-sectional view illustrating a white organic light emitting device 200 according to a second embodiment of the present invention. In describing the present embodiment, descriptions on elements which are the same as or correspond to the elements according to the preceding embodiment are not repeated.

The white organic light emitting device 200 illustrated in FIG. 9 includes first and second electrodes 202 and 204 and a first emission part 210, a second emission part 220, and a third emission part 230 between the first and second electrodes 202 and 204. Here, the first and second electrodes 202 and 204 and the first to third emission parts 210, 220 and 230 may be disposed on a substrate 201.

The first electrode 202 is an anode that supplies a hole, and may be formed of gold (Au), silver (Ag), aluminum (Al), molybdenum (Mo), magnesium (Mg), or an alloy thereof. However, the present embodiment is not limited thereto.

The second electrode 204 is a cathode that supplies an electron, and may be formed of indium tin oxide (ITO) or indium zinc oxide (IZO) which is a transparent conductive material such as transparent conductive oxide (TCO). However, the present embodiment is not limited thereto. Alternatively, the second electrode 204 may be formed of gold (Au), silver (Ag), aluminum (Al), molybdenum (Mo), or magnesium (Mg), which is a metal material, or may be formed of an alloy thereof, but the present embodiment is not limited thereto. Alternatively, the second electrode 204 may be formed of two layers which are formed of TCO, ITO, IZO, or IGZO and gold (Au), silver (Ag), aluminum (Al), molybdenum (Mo), or magnesium (Mg) which is a metal material, but the present embodiment is not limited thereto.

Each of the first electrode 202 and the second electrode 204 may be referred to as an anode or a cathode.

The first electrode 202 may be formed as a reflective electrode, and the second electrode 204 may be formed as a semitransmissive electrode.

In the second embodiment of the present invention, a position of the first electrode 202 and emission positions of a first EML of the first emission part 210, a second EML of the second emission part 220, and a third EML of the third emission part 230 may be adjusted with respect to the second electrode 204, thereby enhancing emission efficiency and a color viewing angle.

A position L0 of the first electrode 202 may be within a range of 500 nm to 600 nm with respect to the second electrode 204. Alternatively, the position L0 of the first electrode 202 may be within a range of 500 nm to 600 nm with respect to a reflective surface of the second electrode 204. Also, emission peaks of emission layers configuring the first to third emission parts 210, 220 and 230 may be located at a specific wavelength, and light having the specific wavelength may be emitted, thereby improving emission efficiency. Also, the first to third emission parts 210, 220 and 230 may have a maximum emission range in emission areas of the first to third EMLs.

The third emission part 230 may include a third ETL 236, a third EML 234, and a third HTL 232 which are disposed under the second electrode 204. Although not shown, an EIL may be further formed on the third ETL 236. The EIL may inject an electron, supplied from the second electrode 204, into the third ETL 236.

The third ETL 236 may be formed of two or more layers or two or more materials.

The third HTL 232 may be formed of two or more layers or two or more materials.

A hole injection layer (HIL) may be further formed under the third HTL 232.

A hole blocking layer (HBL) may be further formed on the third EML 234. The third ETL 236 and the HBL may be provided as one layer.

An electron blocking layer (EBL) may be further formed under the third EML 234. The third HTL 232 and the EBL may be provided as one layer.

The third EML 234 may be configured with at least one of a yellow-green emission layer, a green emission layer, a yellow emission layer and a red emission layer, a red emission layer and a green emission layer, and a yellow-green emission layer and a red emission layer, or may be configured by a combination thereof. When the red emission layer is further provided along with the yellow-green emission layer, an emission efficiency of the red emission layer can be further improved. The red emission layer may be disposed on or under the yellow-green emission layer. Also, the yellow emission layer and the red emission layer, the red emission layer and the green emission layer, or the yellow-green emission layer and the red emission layer may be disposed on or under the third EML 234. Also, the yellow emission layer and the red emission layer, the red emission layer and the green emission layer, or the yellow-green emission layer and the red emission layer may be identically or differently provided as the auxiliary emission layer on and under the third EML 234.

Moreover, a peak wavelength ($\lambda$max) of the yellow emission layer may be within a range of 540 nm to 580 nm. A peak wavelength ($\lambda$max) of the red emission layer may be within a range of 600 nm to 650 nm. Therefore, a peak wavelength ($\lambda$max) of the yellow emission layer and the red emission layer may be within a range of 540 nm to 650 nm. Here, the peak wavelength may be an emission area. When the third EML 234 is configured with two layers (for example, the yellow emission layer and the red emission layer), an emission efficiency of the red emission layer can increase.

Moreover, a peak wavelength ($\lambda$max) of the red emission layer may be within a range of 600 nm to 650 nm. A peak wavelength ($\lambda$max) of the green emission layer may be within a range of 510 nm to 560 nm. Therefore, a peak wavelength ($\lambda$max) of the red emission layer and the green emission layer may be within a range of 510 nm to 650 nm. Here, the peak wavelength may be an emission area. When the third EML 234 is configured with two layers (for example, the red emission layer and the green emission layer), a color reproduction rate can be enhanced.

Moreover, a peak wavelength ($\lambda$max) of the yellow emission layer may be within a range of 540 nm to 580 nm. A peak wavelength ($\lambda$max) of the red emission layer may be within a range of 600 nm to 650 nm. Therefore, a peak wavelength ($\lambda$max) of the yellow emission layer and the red emission layer may be within a range of 540 nm to 650 nm. Here, the peak wavelength may be an emission area. When the third EML 234 is configured with two layers (for example, the yellow emission layer and the red emission layer), an emission efficiency of the red emission layer can increase.

Moreover, the third EML 234 of the third emission part 230 may be configured with two layers (for example, the red emission layer and the yellow-green emission layer) depending on a characteristic or a structure of a device. A peak wavelength ($\lambda$max) of the red emission layer may be within a range of 600 nm to 650 nm. A peak wavelength ($\lambda$max) of the yellow-green emission layer may be within a range of 510 nm to 580 nm. When the third EML 234 is configured with two layers (for example, the red emission layer and the yellow-green emission layer), an emission efficiency of the red emission layer can increase. In this case, a peak wavelength (λmax) of the third EML 234 may be set to a range of 510 nm to 650 nm. Here, the peak wavelength may be an emission area.

When the third EML 234 is configured with at least one of a yellow-green emission layer, a yellow emission layer and a red emission layer, a red emission layer and a green emission layer, and a yellow-green emission layer and a red emission layer, or is configured by a combination thereof, a peak wavelength of the third EML 234 may be within a range of 510 nm to 650 nm. Here, the peak wavelength may be an emission area.

A peak wavelength (λmax) of the yellow-green emission layer may be within a range of 540 nm to 575 nm. Here, the peak wavelength may be an emission area.

Therefore, an emission position L1 of the third EML 234 may be within a range of 20 nm to 80 nm with respect to the second electrode 204 so as to enhance a color viewing angle or a color reproduction rate and an emission efficiency of the third EML 234. Alternatively, the emission position L1 of the third EML 234 may be within a range of 20 nm to 80 nm with respect to the reflective surface of the second electrode 204.

The second emission part 220 may include a second HTL 222, a second EML 224, and a second ETL 226.

Although not shown, in the second emission part 220, an EIL may be further formed on the second ETL 226.

The second ETL 226 may be formed of the same material as that of the third ETL 236, but is not limited thereto.

The second ETL 226 may be formed of two or more layers or two or more materials.

The second HTL 222 may be formed of the same material as that of the third HTL 232, but is not limited thereto.

The second HTL 222 may be formed of two or more layers or two or more materials.

An HIL may be further formed under the second HTL 222. The HIL may inject a hole, supplied from a first CGL 240, into the second HTL 222.

An HBL may be further formed on the second EML 224. The second ETL 226 and the HBL may be provided as one layer.

An EBL may be further formed under the second EML 224. The second HTL 222 and the EBL may be provided as one layer.

The second EML 224 may be formed as a blue emission layer. The blue emission layer may include one of a blue emission layer, a deep blue emission layer, and as sky blue emission layer. The deep blue emission layer may be disposed in a shorter wavelength range than that the blue emission layer, and thus, a color reproduction rate and luminance are enhanced.

A peak wavelength (λmax) of the second EML 224 may be within a range of 440 nm to 480 nm. Here, the peak wavelength may be an emission area.

The second EML 224 may include an auxiliary emission layer which emits light having a color different from that of light emitted from a blue emission layer. The blue emission layer may include one of a blue emission layer, a deep blue emission layer, and a sky blue emission layer. The auxiliary emission layer may be configured with at least one of a yellow-green emission layer, a red emission layer, and a green emission layer, or may be configured by a combination thereof. When the auxiliary emission layer is further provided, an emission efficiency of the green emission layer or the red emission layer can be further improved. When the second EML 224 is provided along with the auxiliary emission layer, the yellow-green emission layer, the red emission layer, or the green emission layer may be disposed on or under the second EML 224.

Moreover, the yellow-green emission layer, the red emission layer, or the green emission layer may be identically or differently provided as the auxiliary emission layer on and under the second EML 224. The positions or number of emission layers may be selectively determined depending on a structure and a characteristic of a device, but the present embodiment is not limited thereto.

A peak wavelength (λmax) of the second EML 224, including a yellow-green emission layer which is the auxiliary emission layer, may be within a range of 440 nm to 590 nm. Here, the peak wavelength may be an emission area. Also, a peak wavelength (λmax) of the second EML 224, including a red emission layer which is the auxiliary emission layer, may be within a range of 440 nm to 650 nm. Here, the peak wavelength may be an emission area. Also, a peak wavelength (λmax) of the second EML 224, including a green emission layer which is the auxiliary emission layer, may be within a range of 440 nm to 570 nm. Here, the peak wavelength may be an emission area.

Therefore, an emission position L2 of the second EML 224 may be within a range of 150 nm to 200 nm with respect to the second electrode 204 so as to enhance a color viewing angle or a color reproduction rate and an emission efficiency of the second EML 224. Alternatively, the emission position L2 of the second EML 224 may be within a range of 150 nm to 200 nm with respect to the reflective surface of the second electrode 204.

A second CGL 250 may be further formed between the second emission part 220 and the third emission part 230. The second CGL 250 adjusts a balance of electrical charges between the second emission part 220 and the third emission part 230. The second CGL 250 may include an N-type CGL and a P-type CGL. Also, the second CGL 250 may be formed of a single layer.

The first emission part 210 may include a first HTL 212, a first EML 214, and a first ETL 216 which are disposed on the first electrode 202.

Although not shown, an HIL may be further formed on the first electrode 202.

A hole supplied through the first HTL 212 and an electron supplied through the first ETL 216 may be recombined in the first EML 214 to emit light.

The first HTL 212 may be formed of two or more layers or two or more materials.

The first ETL 216 may be formed of two or more layers or two or more materials.

An HBL may be further formed on the first EML 214. The first ETL 216 and the HBL may be provided as one layer.

An EBL may be further formed under the first EML 214. The first HTL 212 and the EBL may be provided as one layer.

A first CGL 240 may be further formed between the first emission part 210 and the second emission part 220. The first CGL 240 adjusts a balance of electrical charges between the first emission part 210 and the second emission part 220. The first CGL 240 may include an N-type CGL and a P-type CGL. Also, the first CGL 240 may be formed of a single layer.

The first EML 214 may be formed as a blue emission layer. The blue emission layer may include one of a blue emission layer, a deep blue emission layer, and a sky blue emission layer. The deep blue emission layer may be disposed in a shorter wavelength range than that the blue emission layer, and thus, a color reproduction rate and luminance are enhanced.

A peak wavelength (λmax) of the first EML 214 may be within a range of 440 nm to 480 nm. Here, the peak wavelength may be an emission area.

The first EML 214 may include an auxiliary emission layer emitting light having a color different from that of light emitted from a blue emission layer. The auxiliary emission layer may be configured with at least one of a yellow-green emission layer, a red emission layer, and a green emission layer, or may be configured by a combination thereof. When the auxiliary emission layer is further provided, an emission efficiency of the green emission layer or the red emission layer can be further improved. When the first EML 214 is provided along with the auxiliary emission layer, the yellow-green emission layer, the red emission layer, or the green emission layer may be disposed on or under the first EML 214.

Moreover, the yellow-green emission layer, the red emission layer, or the green emission layer may be identically or differently provided as the auxiliary emission layer on and under the first EML 214. The positions or number of emission layers may be selectively determined depending on a structure and a characteristic of a device, but the present embodiment is not limited thereto.

A peak wavelength (λmax) of the first EML 214, including a yellow-green emission layer which is the auxiliary emission layer, may be within a range of 440 nm to 590 nm. Here, the peak wavelength may be an emission area. Also, a peak wavelength (λmax) of the first EML 214, including a red emission layer which is the auxiliary emission layer, may be within a range of 440 nm to 650 nm. Here, the peak wavelength may be an emission area. Also, a peak wavelength (λmax) of the first EML 214, including a green emission layer which is the auxiliary emission layer, may be within a range of 440 nm to 570 nm. Here, the peak wavelength may be an emission area.

Therefore, an emission position L3 of the first EML 214 may be within a range of 270 nm to 330 nm with respect to the second electrode 204 so as to enhance a color viewing angle or a color reproduction rate and an emission efficiency of the first EML 214. Alternatively, the emission position L3 of the first EML 214 may be within a range of 270 nm to 330 nm with respect to the reflective surface of the second electrode 204.

A structure illustrated in FIG. 9 is an example of the present invention and may be selectively implemented depending on a structure or a characteristic of an organic light emitting device, but is not limited thereto.

Emission positions of emission layers of an organic light emitting device having the structure illustrated in FIG. 9 will be described in detail with reference to FIG. 10.

Figure 10:
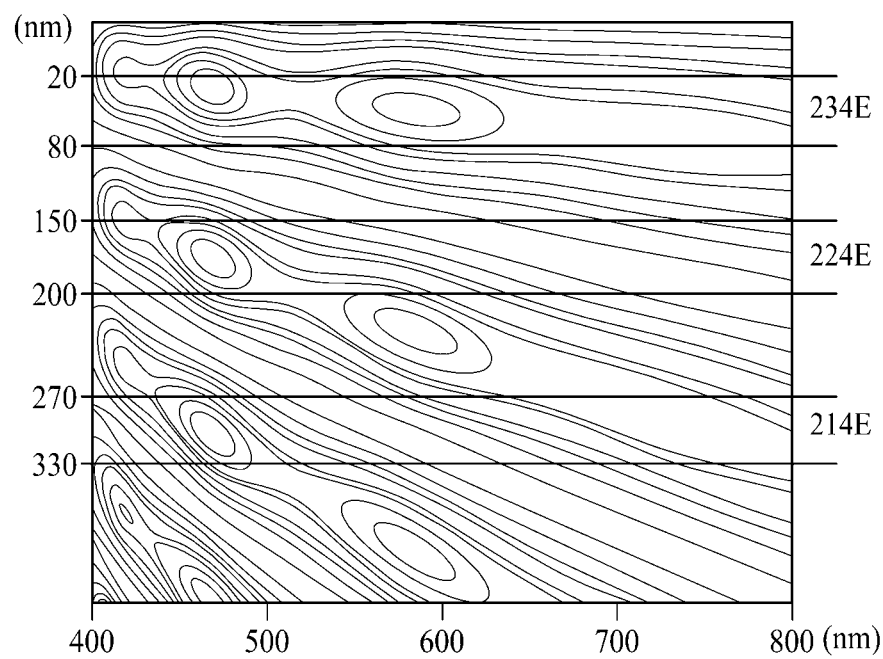
FIG. 10 is a diagram illustrating an emission position of an organic light emitting device according to a second embodiment of the present invention.

FIG. 10 is a diagram illustrating an emission position of an organic light emitting device according to a second embodiment of the present invention.

In FIG. 10, the abscissa axis indicates a wavelength range of light, and the ordinate axis indicates emission positions of emission layers configuring an emission part with respect to the second electrode 204 and may be referred to as a contour map. Here, FIG. 10 shows the emission positions of the emission layers except the first electrode 202 and the second electrode 204.

Since the third EML 234 configuring the third emission part 230 is a yellow-green emission layer, a peak wavelength range of the third EML 234 may be within a range of 540 nm to 575 nm.

Therefore, an emission position of the third EML 234 may be within a range of 20 nm to 80 nm, and thus, an emission peak 234E corresponding to an emission area of the third EML 234 may be located at 540 nm to 575 nm that is a peak wavelength (λmax) of the third EML 234. Accordingly, when the yellow-green emission layer emits light at 540 nm to 575 nm, the maximum efficiency is obtained at the third EML 234.

The third EML 234 of the third emission part 230 may be configured with two layers (for example, a yellow emission layer and a red emission layer) depending on a characteristic or a structure of a device. A peak wavelength range of an emission area of the yellow emission layer may be within a range of 540 nm to 580 nm. A peak wavelength range of an emission area of the red emission layer may be within a range of 600 nm to 650 nm. In this case, therefore, when light is emitted at 540 nm to 650 nm that is the emission area of the third EML 234, the maximum efficiency is obtained at the third EML 234.

Moreover, the third EML 234 of the third emission part 230 may be configured with two layers (for example, a red emission layer and a green emission layer) depending on a characteristic or a structure of a device. A peak wavelength range of an emission area of the red emission layer may be within a range of 600 nm to 650 nm. A peak wavelength range of an emission area of the green emission layer may be within a range of 510 nm to 560 nm. In this case, therefore, when light is emitted at 510 nm to 650 nm that is the emission area of the third EML 234, the maximum efficiency is obtained at the third EML 234.

Moreover, the third EML 234 of the third emission part 230 may be configured with two layers (for example, a red emission layer and a yellow-green emission layer) depending on a characteristic or a structure of a device. A peak wavelength range of an emission area of the red emission layer may be within a range of 600 nm to 650 nm. A peak wavelength range of an emission area of the yellow-green emission layer may be within a range of 510 nm to 580 nm. In this case, therefore, when light is emitted at 510 nm to 650 nm that is the emission area of the third EML 234, the maximum efficiency is obtained at the third EML.

Therefore, when the third EML 234 is configured with one of a yellow-green emission layer, a yellow emission layer and a red emission layer, a red emission layer and a green emission layer, and a yellow-green emission layer and a red emission layer, or is configured by a combination thereof, a peak wavelength range of the emission area of the third EML 234 may be within a range of 510 nm to 650 nm. In this case, when light is emitted at 510 nm to 650 nm that is the emission area of the third EML 234, the maximum efficiency is obtained at the third EML 234.

Since the second EML 224 configuring the second emission part 220 is the blue emission layer, a peak wavelength range of the emission area of the second EML 224 may be within a range of 440 nm to 480 nm. The blue emission layer may include one of a blue emission layer, a deep blue emission layer, and a sky blue emission layer.

Therefore, an emission position of the second EML 224 may be within a range of 150 nm to 200 nm, and thus, an emission peak 224E corresponding to an emission area of the second EML 224 may be located at 440 nm to 480 nm that is a peak wavelength (λmax) of the second EML 224.

Accordingly, when the blue emission layer emits light at 440 nm to 480 nm, the maximum efficiency is obtained at the second EML 224.

Moreover, when the second EML 224 is configured with one of the blue emission layer and the yellow-green emission layer, the blue emission layer and the red emission layer, and the blue emission layer and a green emission layer, or is configured by a combination thereof, a peak wavelength range of the emission area of the second EML 224 may be a range of 440 nm to 650 nm. The blue emission layer may include one of a blue emission layer, a deep blue emission layer, and a sky blue emission layer.

Since the first EML 214 configuring the first emission part 210 is the blue emission layer, a peak wavelength range of the emission area of the first EML 214 may be within a range of 440 nm to 480 nm. The blue emission layer may include one of a blue emission layer, a deep blue emission layer, and a sky blue emission layer.

Therefore, an emission position of the first EML 214 may be within a range of 270 nm to 330 nm, and thus, an emission peak 214E corresponding to an emission area of the first EML 214 may be located at 440 nm to 480 nm that is a peak wavelength ($\lambda$max) of the first EML 214. Accordingly, when the blue emission layer emits light at 440 nm to 480 nm, the maximum efficiency is obtained at the first EML 214.

Moreover, when the first EML 214 is configured with one of the blue emission layer and the yellow-green emission layer, the blue emission layer and the red emission layer, and the blue emission layer and a green emission layer, or is configured by a combination thereof, a peak wavelength range of the emission area of the first EML 214 may be within a range of 440 nm to 650 nm. The blue emission layer may include one of a blue emission layer, a deep blue emission layer, and a sky blue emission layer.

As described above, for the emission position (i.e., 20 nm~80 nm) of the third EML 234, the maximum efficiency is obtained at the second EML 234. The maximum efficiency for the emission position (i.e., 150 nm~200 nm) of the second EML 224 is at the second EML 224. As for the emission position (i.e., 270 nm~330 nm) of the first EML 214, the maximum efficiency is obtained at the first EML 214. Therefore, it can be seen that emission positions of emission layers according to the present invention may be adjust to correspond to peak wavelengths of the emission layers, and thus, each of the emission layers, as a whole, can emit white light its maximum efficiency. Also, an emission efficiency of each emission layer increases, thereby enhancing panel efficiency, a color reproduction rate, or a color viewing angle.

Figure 11:
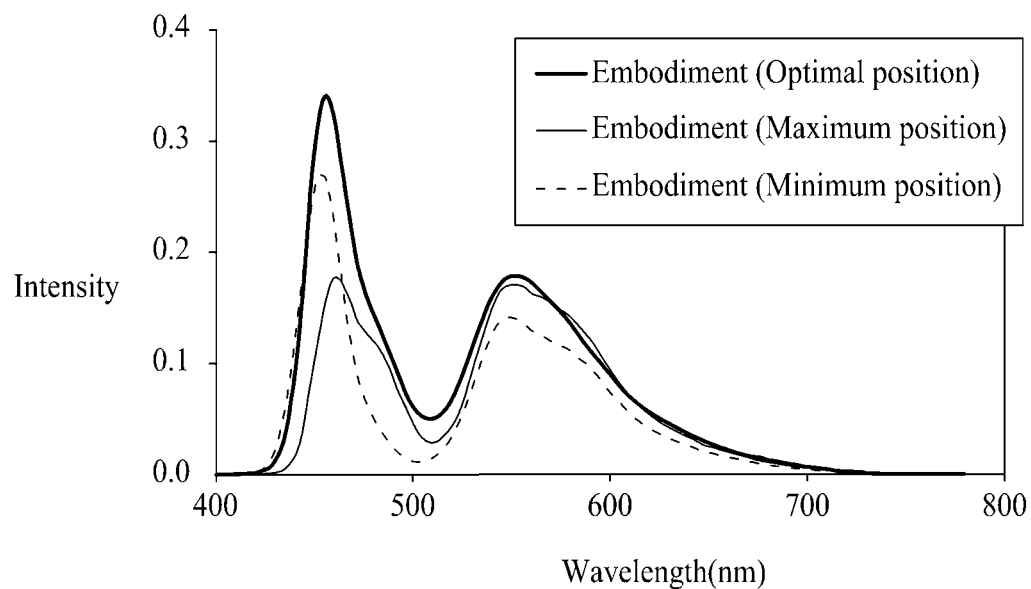
FIG. 11 is a diagram illustrating an EL spectrum according to a second embodiment of the present invention.

FIG. 11 is a diagram illustrating emission intensity according to a second embodiment of the present invention. FIG. 11 may be referred to as an EL spectrum.

In FIG. 11, the abscissa axis indicates a wavelength range of light, and the ordinate axis indicates emission intensity. The emission intensity may be a numerical value which is expressed as a relative value with respect to a maximum value of the EL spectrum.

In FIG. 11, a minimum position according to an embodiment is a portion which is set as a minimum position when emission positions of emission layers are set. For example, when the emission position L1 of the third EML 234 is within a range of 20 nm to 80 nm with respect to the second electrode 204, the minimum position may be set to 20 nm.

A maximum position according to an embodiment is a portion which is set as a maximum position when emission positions of emission layers are set. For example, when the emission position L1 of the third EML 234 is within a range of 20 nm to 80 nm with respect to the second electrode 204, the maximum position may be set to 80 nm.

An optimal position according to an embodiment is a portion which is adjusted as an emission position according to an embodiment of the present invention. For example, when the emission position L1 of the third EML 234 is within a range of 20 nm to 80 nm with respect to the second electrode 204, an emission position of an embodiment may be set to 20 nm to 80 nm.

As shown in FIG. 11, a comparison result which is obtained by comparing an optimal position and a case which is outside of a minimum position of an emission position according to an embodiment of the present invention is as follows. It can be seen that emission intensity is reduced at 440 nm to 480 nm that is a peak wavelength range of blue light. Also, it can be seen that emission intensity is reduced at 540 nm to 575 nm that is a peak wavelength range of yellow-green light. Also, it can be seen that emission intensity is considerably reduced at 600 nm to 650 nm that is a peak wavelength range of red light.

Moreover, a comparison result which is obtained by comparing an optimal position and a case which is outside of a maximum position of an emission position according to an embodiment of the present invention is as follows. It can be seen that emission intensity is reduced at 440 nm to 480 nm that is the peak wavelength range of the blue light. Therefore, blue light emission efficiency is reduced. Also, it can be seen that emission intensity is reduced at 540 nm to 575 nm that is the peak wavelength range of the yellow-green light.

Therefore, it can be seen that emission intensity increases more in the peak wavelength range of the blue light in a case, where an emission position is set as the optimal position according to an embodiment, than a case where the emission position is set as the minimum position or the maximum position according to an embodiment. Also, it can be seen that emission intensity increases more in the peak wavelength range of the yellow-green light in the case where the emission position is set as the optimal position according to an embodiment, than the case where the emission position is set as the minimum position or the maximum position according to an embodiment. Also, it can be seen that emission intensity increases more in the peak wavelength range of the red light in the case where the emission position is set as the optimal position according to an embodiment, than the case where the emission position is set as the minimum position or the maximum position according to an embodiment.

Figure 12:
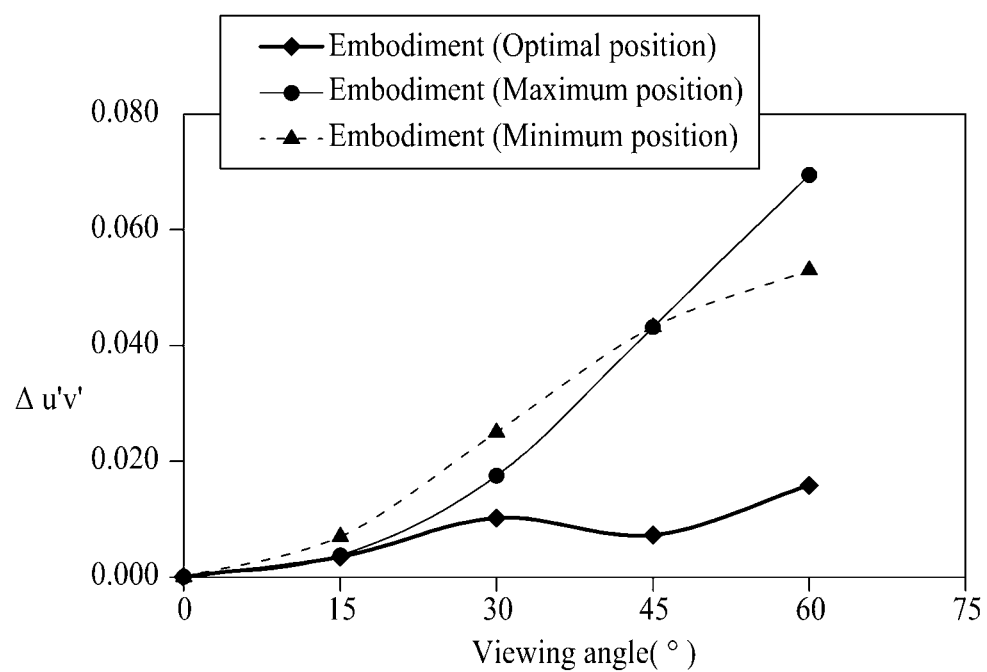
FIG. 12 is a diagram illustrating a color viewing angle according to a second embodiment of the present invention.

FIG. 12 is a graph showing a color viewing angle "$\Delta u'v'$" based on a viewing angle. As illustrated in FIG. 12, the color viewing angle has been measured at 0 degree, 15 degrees, 30 degrees, 45 degrees, and 60 degrees while looking at a device from the front to the side portion.

In FIG. 12, a minimum position according to an embodiment is a portion which is set as a minimum position when emission positions of emission layers are set. For example, when the emission position L1 of the third EML 234 is within a range of 20 nm to 80 nm with respect to the second electrode 204, the minimum position may be set to 20 nm.

A maximum position according to an embodiment is a portion which is set as a maximum position when emission positions of emission layers are set. For example, when the emission position L1 of the third EML 234 is within a range of 20 nm to 80 nm with respect to the second electrode 204, the maximum position may be set to 80 nm.

An optimal position according to an embodiment is a portion which is set as an emission position according to an embodiment of the present invention. For example, when the emission position L1 of the third EML 234 is within a range of 20 nm to 80 nm with respect to the second electrode 204, an emission position of an embodiment may be set to 20 nm to 80 nm.

As shown in FIG. 12, a comparison result which is obtained by comparing an optimal position and a case which is a minimum position of an emission position according to an embodiment of the present invention is as follows. When an emission position is the optimal position of the present invention, it can be seen that the color viewing angle "Δu'v'" is 0.016 when a viewing angle of light emitted from an organic light emitting device is 60 degrees. Also, when the emission position deviates from the minimum position, it can be seen that the color viewing angle "Δu'v'" is 0.050 when a viewing angle of the light emitted from the organic light emitting device is 60 degrees. Therefore, when the emission position deviates from the minimum position, the color viewing angle "Δu'v'" is 0.050 or more, and for this reason, a defect of a color viewing angle or a color reproduction rate based on a viewing angle occurs in a screen of an organic light emitting display apparatus. Accordingly, a user feels a change in a color depending on a viewing angle.

Moreover, a comparison result which is obtained by comparing an optimal position and a case which is a maximum position of an emission position according to an embodiment of the present invention is as follows. When an emission position is the optimal position of the present invention, it can be seen that the color viewing angle "Δu'v'" is 0.016 when a viewing angle of the light emitted from the organic light emitting device is 60 degrees. Also, when the emission position deviates from the maximum position, it can be seen that the color viewing angle "Δu'v'" is 0.070 when a viewing angle of the light emitted from the organic light emitting device is 60 degrees. Therefore, when the emission position deviates from the maximum position, the color viewing angle "Δu'v'" is 0.070 or more, and for this reason, a defect of a color viewing angle or a color reproduction rate based on a viewing angle occurs in the screen of the organic light emitting display apparatus. Accordingly, the user feels a change in a color depending on a viewing angle.

Therefore, it can be seen that the color viewing angle "Δu'v'" is 0.016 in a 60-degree viewing angle of the light emitted from the organic light emitting device in a case where the emission position is set as the optimal position according to an embodiment, instead of a case where the emission position is set as the minimum position or the maximum position according to an embodiment. In the embodiment, the color viewing angle "Δu'v'" based on a viewing angle is small, and thus, a color change rate which the user feels depending on a viewing angle is improved. Also, the color viewing angle "Δu'v'" of white is reduced, and thus, when an organic light emitting display apparatus is implemented, the same color is easily realized irrespective of a viewing-angle position. Also, a defect of a color viewing angle or a color reproduction rate based on a viewing angle occurs in a screen of the organic light emitting display apparatus.

Moreover, emission positions of the first to third EMLs may be adjusted so as to enhance emission efficiency and a color viewing angle in consideration of a cavity peak and a spectrum change rate of each of the emission layers.

A position of the first electrode may be within a range of 500 nm to 600 nm with respect to the second electrode.

An emission position of the third EML may be within a range of 20 nm to 80 nm with respect to the second electrode.

An emission position of the second EML may be within a range of 150 nm to 200 nm with respect to the second electrode.

An emission position of the first EML may be set to a range of 270 nm to 330 nm with respect to the second electrode.

The color viewing angle "Δu'v'" may be equal to or less than 0.016 when a viewing angle of light emitted from the organic light emitting device is 60 degrees.

Figure 13:
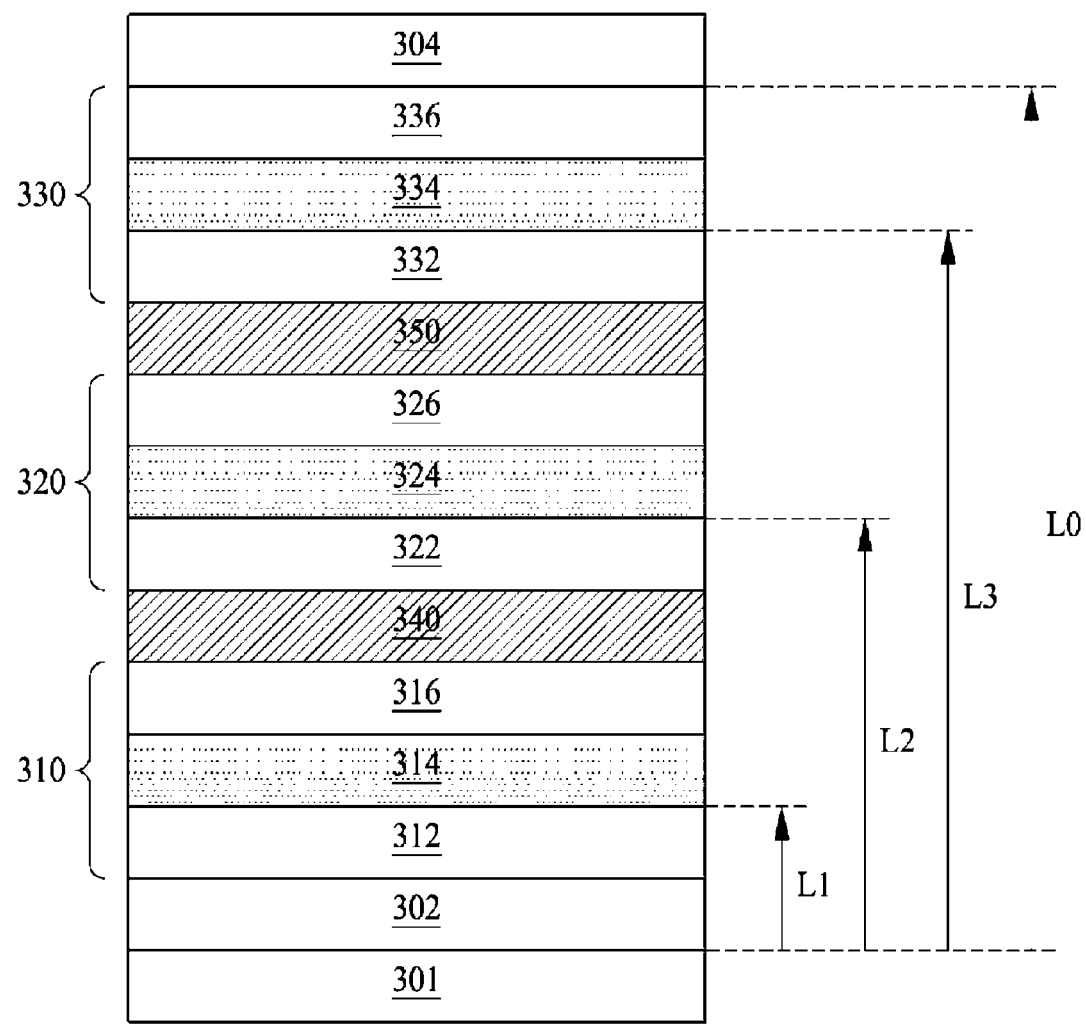
FIG. 13 is a schematic cross-sectional view illustrating a white organic light emitting device according to a third embodiment of the present invention.

FIG. 13 is a schematic cross-sectional view illustrating a white organic light emitting device 300 according to a third embodiment of the present invention. In describing the present embodiment, descriptions on elements which are the same as or correspond to the elements according to the preceding embodiment are not repeated.

In the present embodiment, emission positions of emission layers are adjusted with respect to a first electrode, and may be set with respect to the first electrode depending on a device design.

Each of a first electrode 302 and a second electrode 304 may be referred to as an anode or a cathode.

The first electrode 302 may be formed as a reflective electrode, and the second electrode 304 may be formed as a semitransmissive electrode.

A first emission part 310 may include a first HTL 312, a first EML 314, and a first ETL 316 which are disposed on the first electrode 302.

In the third embodiment of the present invention, a position of the second electrode 304 and emission positions of the first EML 314 of the first emission part 310, a second EML 324 of a second emission part 320, and a third EML 334 of a third emission part 330 may be adjusted with respect to the first electrode 302, thereby enhancing emission efficiency and a color viewing angle or a color reproduction rate.

A position L0 of the second electrode 304 may be within a range of 500 nm to 600 nm with respect to the first electrode 302. Alternatively, the position L0 of the second electrode 304 may be within a range of 500 nm to 600 nm with respect to an interface of a substrate 301 and the first electrode 302. Also, emission peaks of emission layers configuring the first to third emission parts 310, 320 and 330 may be located at a specific wavelength, and light having the specific wavelength may be emitted, thereby improving light emission efficiency. Also, the first to third emission parts 310, 320 and 330 may have a maximum emission range in emission areas of the first to third EMLs.

The first emission part 310 may include a first HTL 312, a first EML 314, and a first ETL 316 which are disposed on the first electrode 302.

Although not shown, an HIL may be further formed on the first electrode 302.

The first HTL 312 may be formed of two or more layers or two or more materials.

The first ETL 316 may be formed of two or more layers or two or more materials.

An HBL may be further formed on the first EML 314. The first ETL 316 and the HBL may be provided as one layer.

An EBL may be further formed under the first EML 314. The first HTL 312 and the EBL may be provided as one layer.

The first EML 314 may be formed as a blue emission layer. The blue emission layer may include one of a blue emission layer, a deep blue emission layer, and a sky blue emission layer. The deep blue emission layer may be disposed in a shorter wavelength range than that the blue emission layer, and thus, a color reproduction rate and luminance are enhanced.

A peak wavelength (λmax) of the first EML 314 may be within a range of 440 nm to 480 nm. Here, the peak wavelength may be an emission area.

The first EML 314 may include an auxiliary emission layer emitting light having a color different from that of light emitted from a blue emission layer. The blue emission layer may include one of a blue emission layer, a deep blue emission layer, and a sky blue emission layer. The auxiliary emission layer may be configured with one of a yellow-green emission layer, a red emission layer, and a green emission layer, or may be configured by a combination thereof. When the auxiliary emission layer is further provided, an emission efficiency of the green emission layer or the red emission layer can be further improved. When the first EML 314 is provided along with the auxiliary emission layer, the yellow-green emission layer, the red emission layer, or the green emission layer may be disposed on or under the first EML 314.

Moreover, the yellow-green emission layer, the red emission layer, or the green emission layer may be identically or differently provided as the auxiliary emission layer on and under the first EML 314. The positions or number of emission layers may be selectively determined depending on a structure and a characteristic of a device, but the present embodiment is not limited thereto.

A peak wavelength (λmax) of the first EML 314, including a yellow-green emission layer which is the auxiliary emission layer, may be within a range of 440 nm to 590 nm. Here, the peak wavelength may be an emission area. Also, a peak wavelength (λmax) of the first EML 314, including a red emission layer which is the auxiliary emission layer, may be within a range of 440 nm to 650 nm. Here, the peak wavelength may be an emission area. Also, a peak wavelength (λmax) of the first EML 314, including a green emission layer which is the auxiliary emission layer, may be within a range of 440 nm to 570 nm. Here, the peak wavelength may be an emission area.

Therefore, an emission position L1 of the first EML 314 may be within a range of 100 nm to 150 nm with respect to the first electrode 302 so as to enhance a color viewing angle or a color reproduction rate and an emission efficiency of the first EML 314. Alternatively, the emission position L1 of the first EML 314 may be within a range of 100 nm to 150 nm with respect to the interface of the substrate 301 and the first electrode 302.

The second emission part 320 may include a second HTL 322, a second EML 324, and a second ETL 326.

Although not shown, in the second emission part 320, an EIL may be further formed on the second ETL 326.

The second ETL 326 may be formed of two or more layers or two or more materials.

The second HTL 322 may be formed of two or more layers or two or more materials.

An HIL may be further formed under the second HTL 322.

An HBL may be further formed on the second EML 324. The second ETL 326 and the HBL may be provided as one layer.

An EBL may be further formed under the second EML 324. The second HTL 322 and the EBL may be provided as one layer.

The second EML 324 may be formed as a blue emission layer. The blue emission layer may include one of a blue emission layer, a deep blue emission layer, and a sky blue emission layer. The deep blue emission layer may be disposed in a shorter wavelength range than that the blue emission layer, and thus, a color reproduction rate and luminance are enhanced.

A peak wavelength (λmax) of the second EML 324 may be within a range of 440 nm to 480 nm. Here, the peak wavelength may be an emission area.

The second EML 324 may include an auxiliary emission layer emitting light having a color different from that of light emitted from a blue emission layer. The blue emission layer may include one of a blue emission layer, a deep blue emission layer, and a sky blue emission layer. The auxiliary emission layer may be configured with one of a yellow-green emission layer, a red emission layer, and a green emission layer, or may be configured by a combination thereof. When the auxiliary emission layer is further provided, an emission efficiency of the green emission layer or the red emission layer can be further improved. When the second EML 324 is provided along with the auxiliary emission layer, the yellow-green emission layer, the red emission layer, or the green emission layer may be disposed on or under the second EML 324.

Moreover, the yellow-green emission layer, the red emission layer, or the green emission layer may be identically or differently provided as the auxiliary emission layer on and under the second EML 324. The positions or number of emission layers may be selectively determined depending on a structure and a characteristic of a device, but the present embodiment is not limited thereto.

A peak wavelength (λmax) of the second EML 324, including a yellow-green emission layer which is the auxiliary emission layer, may be within a range of 440 nm to 590 nm. Here, the peak wavelength may be an emission area. Also, a peak wavelength (λmax) of the second EML 324, including a red emission layer which is the auxiliary emission layer, may be within a range of 440 nm to 650 nm. Here, the peak wavelength may be an emission area. Also, a peak wavelength (λmax) of the second EML 324, including a green emission layer which is the auxiliary emission layer, may be within a range of 440 nm to 570 nm. Here, the peak wavelength may be an emission area.

Therefore, an emission position L2 of the second EML 324 may be within a range of 240 nm to 280 nm with respect to the first electrode 302 so as to enhance a color viewing angle or a color reproduction rate and an emission efficiency of the second EML 324. Alternatively, the emission position L2 of the second EML 324 may be within a range of 240 nm to 280 nm with respect to the interface of the substrate 301 and the second electrode 304.

A first CGL 340 may be further formed between the first emission part 310 and the second emission part 320. The first CGL 340 adjusts a balance of electrical charges between the first emission part 310 and the second emission part 320. The first CGL 340 may include an N-type CGL and a P-type CGL. Also, the first CGL 340 may be formed of a single layer.

The third emission part 330 may include a third ETL 336, a third EML 334, and a third HTL 332 which are disposed under the second electrode 304. Although not shown, an EIL may be further formed on the third ETL 336.

The third ETL 336 may be formed of two or more layers or two or more materials.

The third HTL 332 may be formed of two or more layers or two or more materials.

An HIL may be further formed under the third HTL 332.

An HBL may be further formed on the third EML 334. The third ETL 336 and the HBL may be provided as one layer.

An EBL may be further formed under the third EML 334. The third HTL 332 and the EBL may be provided as one layer.

A second CGL 350 may be further formed between the second emission part 320 and the third emission part 330. The second CGL 350 adjusts a balance of electrical charges between the second emission part 320 and the third emission part 330. The second CGL 350 may include an N-type CGL and a P-type CGL. Also, the second CGL 350 may be formed of a single layer.

The third EML 334 may be configured with one of a yellow-green emission layer, a green emission layer, a yellow emission layer and a red emission layer, a red emission layer and a green emission layer, and a yellow-green emission layer and a red emission layer, or may be configured by a combination thereof. When the red emission layer is further provided along with the yellow-green emission layer, an emission efficiency of the red emission layer can be further improved. The red emission layer may be disposed on or under the yellow-green emission layer. Also, the yellow emission layer and the red emission layer, the red emission layer and the green emission layer, or the yellow-green emission layer and the red emission layer may be disposed on or under the third EML 334. Also, the yellow emission layer and the red emission layer, the red emission layer and the green emission layer, or the yellow-green emission layer and the red emission layer may be identically or differently provided as the auxiliary emission layer on and under the third EML 334.

Moreover, a peak wavelength ($\lambda$max) of the yellow emission layer may be within a range of 540 nm to 580 nm. A peak wavelength ($\lambda$max) of the red emission layer may be within a range of 600 nm to 650 nm. Therefore, a peak wavelength ($\lambda$max) of the yellow emission layer and the red emission layer may be within a range of 540 nm to 650 nm. Here, the peak wavelength may be an emission area. When the third EML 334 is configured with two layers (for example, the yellow emission layer and the red emission layer), an emission efficiency of the red emission layer can increase.

Moreover, a peak wavelength ($\lambda$max) of the red emission layer may be within a range of 600 nm to 650 nm. A peak wavelength ($\lambda$max) of the green emission layer may be within a range of 510 nm to 560 nm. Therefore, a peak wavelength ($\lambda$max) of the red emission layer and the green emission layer may be within a range of 510 nm to 650 nm. Here, the peak wavelength may be an emission area. When the third EML 334 is configured with two layers (for example, the red emission layer and the green emission layer), a color reproduction rate can be enhanced.

Moreover, a peak wavelength ($\lambda$max) of the yellow emission layer may be within a range of 540 nm to 580 nm. A peak wavelength ($\lambda$max) of the red emission layer may be within a range of 600 nm to 650 nm. Therefore, a peak wavelength ($\lambda$max) of the yellow emission layer and the red emission layer may be within a range of 540 nm to 650 nm. Here, the peak wavelength may be an emission area. When the third EML 334 is configured with two layers (for example, the yellow emission layer and the red emission layer), an emission efficiency of the red emission layer can increase.

Moreover, the third EML 334 of the third emission part 330 may be configured with two layers (for example, the red emission layer and the yellow-green emission layer) depending on a characteristic or a structure of a device. A peak wavelength ($\lambda$max) of the red emission layer may be within a range of 600 nm to 650 nm. A peak wavelength ($\lambda$max) of the yellow-green emission layer may be within a range of 510 nm to 580 nm. When the third EML 334 is configured with two layers (for example, the red emission layer and the yellow-green emission layer), an emission efficiency of the red emission layer can increase. In this case, a peak wavelength ($\lambda$max) of the third EML 334 may be within a range of 510 nm to 650 nm. Here, the peak wavelength may be an emission area.

When the third EML 334 is configured with one of a yellow-green emission layer, a yellow emission layer and a red emission layer, a red emission layer and a green emission layer, and a yellow-green emission layer and a red emission layer, or is configured by a combination thereof, a peak wavelength of the third EML 334 may be within a range of 510 nm to 650 nm. Here, the peak wavelength may be an emission area.

A peak wavelength ($\lambda$max) of the yellow-green emission layer may be within a range of 540 nm to 575 nm. Here, the peak wavelength may be an emission area.

Therefore, an emission position L3 of the third EML 334 may be within a range of 370 nm to 410 nm with respect to the first electrode 302 so as to enhance a color viewing angle or a color reproduction rate and an emission efficiency of the third EML 334. Alternatively, the emission position L3 of the third EML 334 may be within a range of 370 nm to 410 nm with respect to the interface of the substrate 301 and the first electrode 302.

A structure illustrated in FIG. 13 is an example of the present invention and may be selectively implemented depending on a structure or a characteristic of an organic light emitting device, but is not limited thereto.

Emission positions of emission layers of an organic light emitting device having the structure illustrated in FIG. 13 will be described in detail with reference to FIG. 14.

Figure 14:
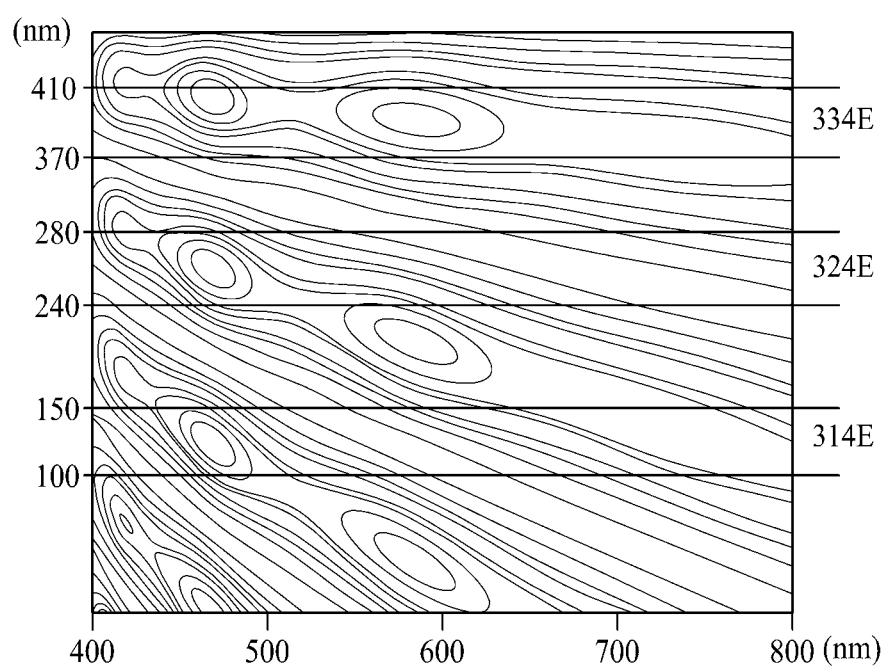
FIG. 14 is a diagram illustrating an emission position of an organic light emitting device according to a third embodiment of the present invention.

FIG. 14 is a diagram illustrating an emission position of an organic light emitting device according to a third embodiment of the present invention.

In FIG. 14, the abscissa axis indicates a wavelength range of light, and the ordinate axis indicates emission positions of emission layers configuring an emission part with respect to the second electrode 304 and may be referred to as a contour map. Here, FIG. 14 shows the emission positions of the emission layers except the first electrode 302 and the second electrode 304.

Since the first EML 314 configuring the first emission part 310 is the blue emission layer, a peak wavelength range of an emission area of the first EML 314 may be within a range of 440 nm to 480 nm. The blue emission layer may include one of a blue emission layer, a deep blue emission layer, and a sky blue emission layer.

Moreover, when the first EML 314 is configured with one of the blue emission layer and the yellow-green emission layer, the blue emission layer and the red emission layer, and the blue emission layer and a green emission layer, or is configured by a combination thereof, a peak wavelength range of the emission area of the first EML 314 may be within a range of 440 nm to 650 nm. The blue emission layer may include one of a blue emission layer, a deep blue emission layer, and a sky blue emission layer.

Therefore, an emission position of the first EML 314 may be within a range of 100 nm to 150 nm, and thus, an emission peak 314E corresponding to an emission area of the first EML 314 may be located at 440 nm to 480 nm that is a peak wavelength ($\lambda$max) of the first EML 314. Accordingly, when the blue emission layer emits light at 440 nm to 480 nm, the maximum efficiency is obtained at the first EML 314.

The blue emission layer may include one of a blue emission layer, a deep blue emission layer, and a sky blue emission layer.

Since the second EML 324 configuring the second emission part 320 is the blue emission layer, a peak wavelength range of an emission area of the second EML 324 may be within a range of 440 nm to 480 nm.

Therefore, an emission position of the second EML 324 may be within a range of 240 nm to 280 nm, and thus, an emission peak 324E corresponding to an emission area of the second EML 324 may be located at 440 nm to 480 nm that is a peak wavelength (λmax) of the second EML 324. Accordingly, when the blue emission layer emits light at 440 nm to 480 nm, the maximum efficiency is obtained at the second EML 324. The blue emission layer may include one of a blue emission layer, a deep blue emission layer, and a sky blue emission layer.

Moreover, when the second EML 324 is configured with one of the blue emission layer and the yellow-green emission layer, the blue emission layer and the red emission layer, and the blue emission layer and a green emission layer, or is configured by a combination thereof, a peak wavelength range of an emission area of the second EML 324 may be within a range of 440 nm to 650 nm. The blue emission layer may include one of a blue emission layer, a deep blue emission layer, and a sky blue emission layer.

Since the third EML 334 configuring the third emission part 330 is a yellow-green emission layer, a peak wavelength range of the third EML 334 may be within a range of 540 nm to 575 nm.

Therefore, an emission position of the third EML 334 may be within a range of 370 nm to 410 nm, and thus, an emission peak 334E corresponding to an emission area of the third EML 334 may be located at 540 nm to 575 nm that is a peak wavelength (λmax) of the third EML 334. Accordingly, when the yellow-green emission layer emits light at 540 nm to 575 nm, the maximum efficiency is obtained at the third EML 334.

The third EML 334 of the third emission part 330 may be configured with two layers (for example, a yellow emission layer and a red emission layer) depending on a characteristic or a structure of a device. A peak wavelength range of an emission area of the yellow emission layer may be within a range of 540 nm to 580 nm. A peak wavelength range of an emission area of the red emission layer may be within a range of 600 nm to 650 nm. In this case, therefore, when light is emitted at 540 nm to 650 nm that is the emission area of the third EML 334, the maximum efficiency is obtained at the third EML 334.

Moreover, the third EML 334 of the third emission part 330 may be configured with two layers (for example, a red emission layer and a green emission layer) depending on a characteristic or a structure of a device. A peak wavelength range of an emission area of the red emission layer may be within a range of 600 nm to 650 nm. A peak wavelength range of an emission area of the green emission layer may be within a range of 510 nm to 560 nm. In this case, therefore, when light is emitted at 510 nm to 650 nm that is the emission area of the third EML 334, the maximum efficiency is obtained at the third EML 334.

Moreover, the third EML 334 of the third emission part 330 may be configured with two layers (for example, a red emission layer and a yellow-green emission layer) depending on a characteristic or a structure of a device. A peak wavelength range of an emission area of the red emission layer may be within a range of 600 nm to 650 nm. A peak wavelength range of an emission area of the yellow-green emission layer may be set to a range of 510 nm to 580 nm. In this case, therefore, when light is emitted at 510 nm to 650 nm that is the emission area of the third EML 334, the maximum efficiency is obtained at the third EML 334.

Therefore, when the third EML 334 is configured with one of a yellow-green emission layer, a yellow emission layer and a red emission layer, a red emission layer and a green emission layer, and a yellow-green emission layer and a red emission layer, or is configured by a combination thereof, a peak wavelength range of the emission area of the third EML 334 may be within a range of 510 nm to 650 nm. In this case, when light is emitted at 510 nm to 650 nm that is the emission area of the third EML 334, the maximum efficiency is obtained at the third EML 334.

As described above, for the emission positions (i.e., 100 nm 150 nm) of the first EML 314, the maximum efficiency is obtained at the first EML 314. The maximum efficiency for the second emission position (i.e., 240 nm~280 nm) of the second EML 324 is at the second EML 324. As for the emission position (i.e., 370 nm~410 nm) of the third EML 334, the maximum efficiency is obtained at the third EML 334. Therefore, it can be seen that emission positions of emission layers according to the present invention may be adjusted to correspond to peak wavelengths of the emission layers, and thus, each of the emission layers, as a whole, can emit white light at its maximum efficiency. Also, an emission efficiency of each emission layer increases, thereby enhancing panel efficiency, a color reproduction rate, or a color viewing angle.

Figure 15:
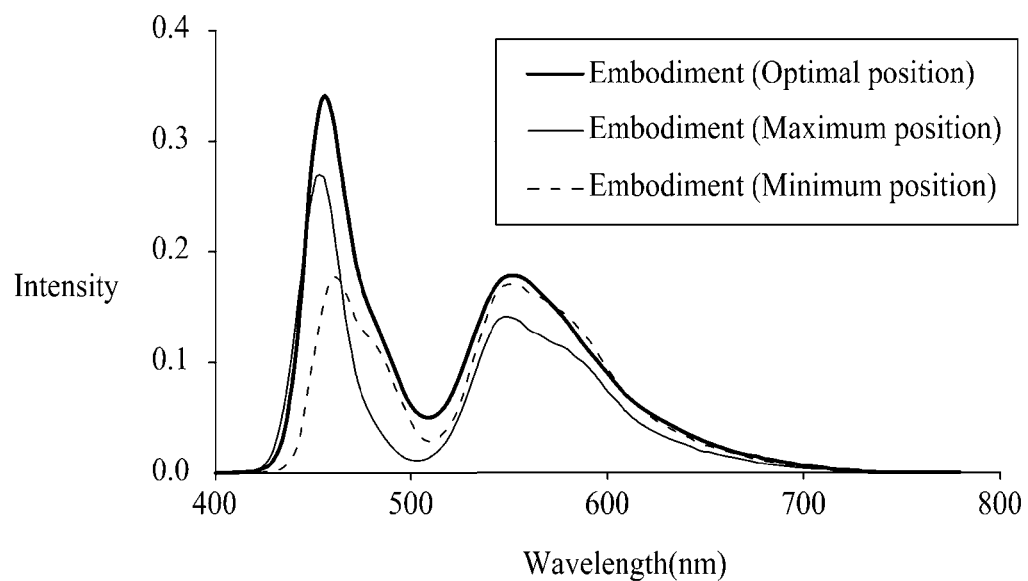
FIG. 15 is a diagram illustrating an EL spectrum according to a third embodiment of the present invention.

FIG. 15 is a diagram illustrating emission intensity according to a third embodiment of the present invention. FIG. 15 shows an EL spectrum.

In FIG. 15, the abscissa axis indicates a wavelength range of light, and the ordinate axis indicates emission intensity. The emission intensity may be a numerical value which is expressed as a relative value with respect to a maximum value of the EL spectrum.

In FIG. 15, a minimum position according to an embodiment is a portion which is set as a minimum position when emission positions of emission layers are set. For example, when the emission position L1 of the first EML 314 is within a range of 100 nm to 150 nm with respect to the first electrode 302, the minimum position may be set to 100 nm.

A maximum position according to an embodiment is a portion which is set as a maximum position when emission positions of emission layers are set. For example, when the emission position L1 of the first EML 314 is within a range of 100 nm to 150 nm with respect to the first electrode 302, the maximum position may be set to 150 nm.

An optimal position according to an embodiment is a portion which is set as an emission position according to an embodiment of the present invention. For example, when the emission position L1 of the first EML 314 is within a range of 100 nm to 150 nm with respect to the first electrode 302, an emission position of an embodiment may be set to 100 nm to 150 nm.

As shown in FIG. 15, a comparison result which is obtained by comparing an optimal position and a case which is a minimum position of an emission position according to an embodiment of the present invention is as follows. It can be seen that emission intensity is reduced at 440 nm to 480 nm that is a peak wavelength range of blue light. Also, it can be seen that emission intensity is reduced at 540 nm to 575 nm that is a peak wavelength range of yellow-green light.

Also, it can be seen that emission intensity is considerably reduced at 600 nm to 650 nm that is a peak wavelength range of red light.

Moreover, a comparison result which is obtained by comparing an optimal position and a case which is a maximum position of an emission position according to an embodiment of the present invention is as follows. It can be seen that emission intensity is reduced at 440 nm to 480 nm that is the peak wavelength range of the blue light. Therefore, blue light emission efficiency is reduced. Also, it can be seen that emission intensity is reduced at 540 nm to 575 nm that is the peak wavelength range of the yellow-green light.

Therefore, it can be seen that emission intensity increases more in the peak wavelength range of the blue light in a case where an emission position is adjusted as the optimal position according to an embodiment, than a case where the emission position is set as the minimum position or the maximum position according to an embodiment. Also, it can be seen that emission intensity increases more in the peak wavelength range of the yellow-green light in the case where the emission position is adjusted as the optimal position according to an embodiment, than the case where the emission position is set as the minimum position or the maximum position according to an embodiment. Also, it can be seen that emission intensity increases more in the peak wavelength range of the red light in the case where the emission position is set as the optimal position according to an embodiment, than the case where the emission position is set as the minimum position or the maximum position according to an embodiment.

Figure 16:
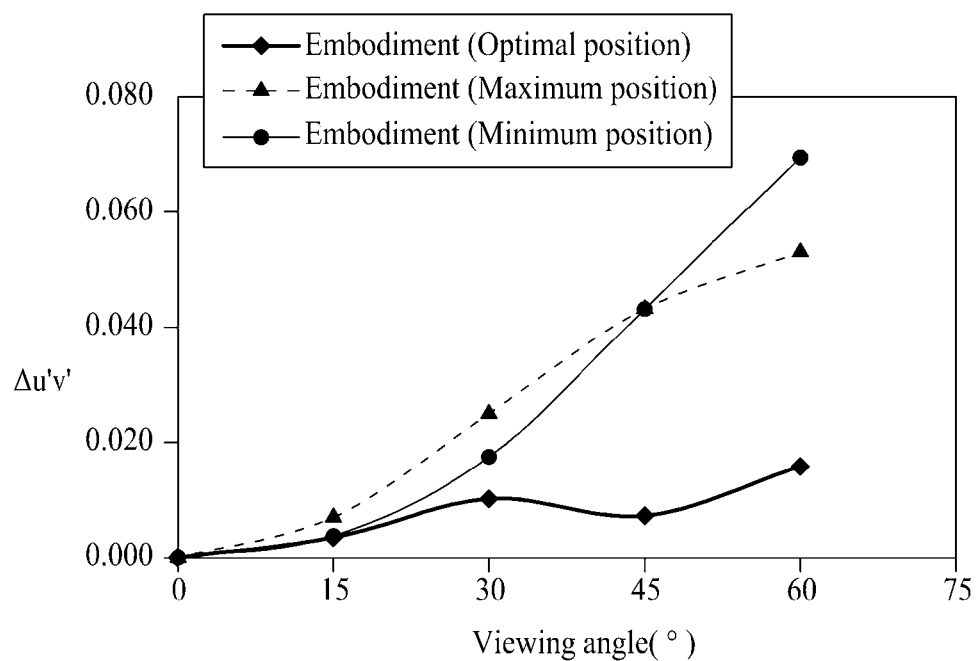
FIG. 16 is a diagram illustrating a color viewing angle according to a third embodiment of the present invention.

FIG. 16 is a graph showing a color viewing angle "Δu'v'" based on a viewing angle. As illustrated in FIG. 16, the color viewing angle has been measured at 0 degrees, 15 degrees, 30 degrees, 45 degrees, and 60 degrees while looking at a device from the front to the side portion.

In FIG. 16, a minimum position according to an embodiment is a portion which is set as a minimum position when emission positions of emission layers are set. For example, when the emission position L1 of the first EML 314 is within a range of 100 nm to 150 nm with respect to the first electrode 302, the minimum position may be set to 100 nm.

A maximum position according to an embodiment is a portion which is set as a maximum position when emission positions of emission layers are set. For example, when the emission position L1 of the first EML 314 is within a range of 100 nm to 150 nm with respect to the first electrode 302, the maximum position may be set to 150 nm.

An optimal position according to an embodiment is a portion which is set as an emission position according to an embodiment of the present invention. For example, when the emission position L1 of the first EML 314 is within a range of 100 nm to 150 nm with respect to the first electrode 302, an emission position of an embodiment may be set to 100 nm to 150 nm.

As shown in FIG. 16, a comparison result which is obtained by comparing an optimal position and a case which is a minimum position of an emission position according to an embodiment of the present invention is as follows. When an emission position is the optimal position of the present invention, it can be seen that the color viewing angle "Δu'v'" is 0.016 when a viewing angle of light emitted from an organic light emitting device is 60 degrees. Also, when the emission position deviates from the minimum position, it can be seen that the color viewing angle "Δu'v'" is 0.070 when a viewing angle of the light emitted from the organic light emitting device is 60 degrees. Therefore, when the emission position deviates from the minimum position, the color viewing angle "Δu'v'" is 0.070 or more, and for this reason, a defect of a color viewing angle or a color reproduction rate based on a viewing angle occurs in a screen of an organic light emitting display apparatus. Accordingly, a user feels a change in a color depending on a viewing angle.

Moreover, a comparison result which is obtained by comparing an optimal position and a case which is a maximum position of an emission position according to an embodiment of the present invention is as follows. When an emission position is the optimal position of the present invention, it can be seen that the color viewing angle "Δu'v'" is 0.016 when a viewing angle of the light emitted from the organic light emitting device is 60 degrees. Also, when the emission position deviates from the maximum position, it can be seen that the color viewing angle "Δu'v'" is 0.050 when a viewing angle of the light emitted from the organic light emitting device is 60 degrees. Therefore, when the emission position deviates from the maximum position, the color viewing angle "Δu'v'" is 0.050 or more, and for this reason, a defect of a color viewing angle or a color reproduction rate based on a viewing angle occurs in the screen of the organic light emitting display apparatus. Accordingly, the user feels a change in a color depending on a viewing angle.

Therefore, it can be seen that the color viewing angle "Δu'v'" is 0.016 in the 60-degree viewing angle of the light emitted from the organic light emitting device in a case where the emission position is set as the optimal position according to an embodiment, instead of a case where the emission position is set as the minimum position or the maximum position according to an embodiment. In the embodiment, the color viewing angle "Δu'v'" based on a viewing angle is small, and thus, a color change rate which the user feels depending on a viewing angle is improved. Also, the color viewing angle "Δu'v'" of white is reduced, and thus, when an organic light emitting display apparatus is implemented, the same color is easily realized irrespective of a viewing-angle position. Also, a defect of a color viewing angle or a color reproduction rate based on a viewing angle occurs in a screen of the organic light emitting display apparatus.

Moreover, emission positions of the first to third EMLs may be adjusted so as to enhance emission efficiency and a color viewing angle based on a cavity peak and a spectrum change rate of each of the emission layers.

A position of the second electrode may be within a range of 500 nm to 600 nm with respect to the first electrode.

An emission position of the first EML may be within a range of 100 nm to 150 nm with respect to the first electrode.

An emission position of the second EML may be within a range of 240 nm to 280 nm with respect to the first electrode.

An emission position of the third EML may be within a range of 370 nm to 410 nm with respect to the first electrode.

The color viewing angle "Δu'v'" may be equal to or less than 0.016 when a viewing angle of light emitted from the organic light emitting device is 60 degrees.

Figure 17:
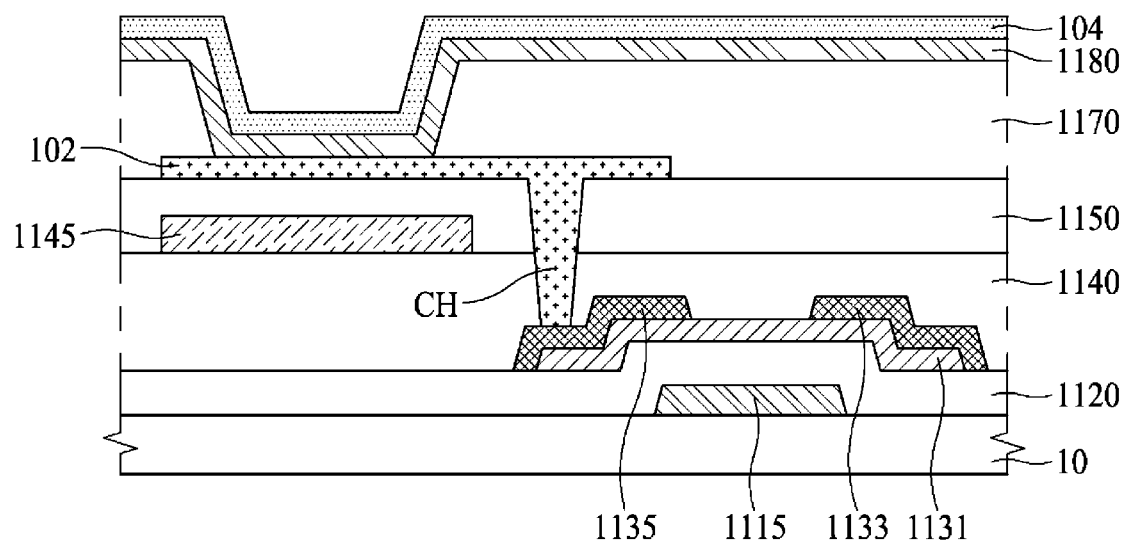
FIG. 17 is a diagram illustrating an organic light emitting display apparatus according to an embodiment of the present invention.

FIG. 17 is a cross-sectional view illustrating an organic light emitting device 1000 according to an embodiment of the present invention, and uses the above-described organic light emitting device according to the first to third embodiments of the present invention.

As illustrated in FIG. 17, the organic light emitting device 1000 according to an embodiment of the present invention includes a substrate 10, a thin film transistor TFT, an overcoating layer 1150, a first electrode 102, an emission part 1180, and a second electrode 104. The TFT includes a gate electrode 1115, a gate insulator 1120, a semiconductor layer 1131, a source electrode 1133, and a drain electrode 1135.

In FIG. 17, the thin film transistor TFT is illustrated as having an inverted staggered structure, but may be formed in a coplanar structure.

The substrate 10 may be formed of glass, metal, or plastic.

The gate electrode 1115 may be formed on the substrate 10 and may be connected to a gate line (not shown). The gate electrode 1115 may include a multilayer formed of one of molybdenum (Mo), aluminum (Al), chromium (Cr), gold (Au), titanium (Ti), nickel (Ni), neodymium (Nd), and copper (Cu) or an alloy thereof.

The gate insulator 1120 may be formed on the gate electrode 1115 and may be formed of silicon oxide (SiOx), silicon nitride (SiNx), or a multilayer thereof, but is not limited thereto.

The semiconductor layer 1131 may be formed on the gate insulator 1120, and may be formed of amorphous silicon (a-Si), polycrystalline silicon (poly-Si), oxide semiconductor, or organic semiconductor. When the semiconductor layer 1131 is formed of oxide semiconductor, the semiconductor layer 1131 may be formed of indium tin oxide (ITO), indium zinc oxide (IZO), or indium tin zinc oxide (ITZO), but is not limited thereto. Also, an etch stopper (not shown) may be formed on the semiconductor layer 1131 and may protect the semiconductor layer 1131, but may be omitted depending on a configuration of a device.

The source electrode 1133 and the drain electrode 1135 may be formed on the semiconductor layer 1131. The source electrode 1133 and the drain electrode 1135 may be formed of a single layer or a multilayer, and may be formed of one of molybdenum (Mo), aluminum (Al), chromium (Cr), gold (Au), titanium (Ti), nickel (Ni), neodymium (Nd), and copper (Cu) or an alloy thereof.

A passivation layer 1140 may be formed on the source electrode 1133 and the drain electrode 1135, and may be formed of SiOx, SiNx, or a multilayer thereof. Alternatively, the passivation layer 1140 may be formed of an acryl resin or a polyimide resin, but is not limited thereto.

A color filter 1145 may be formed on the passivation layer 1140, and although only one sub-pixel is illustrated in the drawing, the color filter 1145 may be formed in each of a red sub-pixel, a blue sub-pixel, and a green sub-pixel. The color filter 1145 may include a red (R) color filter, a green (G) color filter, and a blue (B) color filter which are patterned and formed in respective sub-pixels. The color filter 1145 transmits light having only a specific wavelength among white lights emitted from the emission part 1180.

The overcoating layer 1150 may be formed on the color filter 1145 and may be formed of an acryl resin, a polyimide resin, SiOx, SiNx, or a multilayer thereof, but is not limited thereto.

The first electrode 102 may be formed on the overcoating layer 1150. The first electrode 102 may be electrically connected to the drain electrode 1135 through a contact hole CH which is formed in a certain area of the passivation layer 1140 and the overcoating layer 1150. In FIG. 17, the drain electrode 1135 is illustrated as being electrically connected to the first electrode 102, but the present embodiment is not limited thereto. As another example, the source electrode 1133 may be electrically connected to the first electrode 102 through the contact hole CH which is formed in the certain area of the passivation layer 1140 and the overcoating layer 1150.

A bank layer 1170 may be formed on the first electrode 102 and may define a pixel area. That is, the bank layer 1170 may be formed in a boundary area between a plurality of pixels, and thus, the pixel area may be defined by the bank layer 1170. The bank layer 1170 may be formed of an organic material such as a benzocyclobutene (BCB) resin, an acryl resin, or a polyimide resin. Alternatively, the bank layer 1170 may be formed of a photosensitive material having a black pigment, and in this case, the bank layer 1170 may act as a light blocking member.

The emission part 1180 may be formed on the bank layer 1170. As illustrated in the first to third embodiments of the present invention, the emission part 1180 may include a first emission part 110, a second emission part 120, and a third emission part 130 which are formed on the first electrode 102.

The second electrode 104 may be formed on the emission part 1180.

Although not shown in FIG. 17, an encapsulation part may be formed on the second electrode 104. The encapsulation part prevents moisture from penetrating into the emission part 1180. The encapsulation part may include a plurality of layers where different inorganic materials are stacked, or include a plurality of layers where an inorganic material and an organic material are alternately stacked. Also, an encapsulation substrate may be further formed on the encapsulation part. The encapsulation substrate may be formed of glass, plastic, or metal. The encapsulation substrate may be adhered to the encapsulation part by an adhesive.

As described above, according to the embodiments of the present invention, an emission position of an emission layer is optimized, thereby enhancing red efficiency, green efficiency, and blue efficiency.

Moreover, according to the embodiments of the present invention, an emission position of an emission layer is optimized, thereby enhancing an emission efficiency of the emission layer or panel efficiency and a color viewing angle or a color reproduction rate.

Moreover, according to the embodiments of the present invention, since two emission layers which emit the same color light are disposed adjacent to each other, an emission intensity of an emission layer is enhanced.

Moreover, according to the embodiments of the present invention, an emission intensity of an emission layer increases, and thus, emission efficiency and a color reproduction rate are enhanced. Accordingly, consumption power is lowered, and thus, the white organic light emitting device according to the embodiments of the present invention may be applied to large-size televisions (TVs).

Moreover, according to the embodiments of the present invention, two emission layers which emit the same color light are provided, thereby enhancing device efficiency and a color reproduction rate or a color viewing angle based on a viewing angle.

Moreover, according to the embodiments of the present invention, since two emission layers which emit the same color light are provided in consideration of a spectrum change rate and a cavity peak of each of emission layers, the spectrum change rates of the emission layers are almost similar in difference, thereby enhancing a color reproduction rate or a color viewing angle based on a viewing angle.

Moreover, according to the embodiments of the present invention, since spectrum change rates of emission layers are almost similar in difference, a cavity peak of each of the emission layers is located in an emission area. Therefore, since the cavity peak of each emission layer is located in the emission area, a peak wavelength of each emission layer is located at a desired position, thereby enhancing emission efficiency, device efficiency, and a color reproduction rate or a color viewing angle based on a viewing angle.

The details of the present invention described in technical problem, technical solution, and advantageous effects do not specify essential features of claims, and thus, the scope of claims is not limited by the details described in detailed description of the invention.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A white organic light emitting device, comprising:
   a first emission part between a first electrode and a second electrode, the first emission part having a first emission layer;
   a second emission part on the first emission part, the second emission part having a second emission layer; and
   a third emission part on the second emission part, the third emission part having a third emission layer,
   wherein emission positions of the first, second, and third emission layers are adjusted to enhance emission efficiency and a color viewing angle, based on a spectrum change rate and a cavity peak of each of the first, second, and third emission layers,
   wherein the emission position of the third emission layer is within a range of 20 nm to 80 nm with respect to the second electrode,
   wherein the emission position of the second emission layer is within a range of 150 nm to 200 nm with respect to the second electrode, and
   wherein the emission position of the first emission layer is within a range of 270 nm to 330 nm with respect to the second electrode.

2. The device of claim 1, wherein the third emission layer comprises at least one of a yellow-green emission layer, a green emission layer, a red emission layer and a green emission layer, a yellow emission layer and a red emission layer, a yellow-green emission layer and a red emission layer, or a combination thereof.

3. The device of claim 1, wherein a peak wavelength of the third emission layer is within a range of 540 nm to 650 nm.

4. The device of claim 1, wherein the color viewing angle is equal to or less than 0.016 when a viewing angle of light emitted from the white organic light emitting device is 60 degrees.

5. The device of claim 1, wherein a position of the first electrode is within a range of 500 nm to 600 nm with respect to the second electrode.

6. The device of claim 1, wherein each of the first, second, and third emission parts includes at least one of a hole transport layer, a hole injection layer, a hole blocking layer, an electron transport layer, and an electron blocking layer.

7. The device of claim 1, further comprising:
   a first charge generation layer between the first emission part and the second emission part; and
   a second charge generation layer between the second emission part and the third emission part.

8. The device of claim 1, wherein at least two emission layers of the first, second, and third emission layers respectively emit light having a same color and the at least two emission layers are adjacent to each other.

9. The device of claim 8, wherein the at least two emission layers are closer to the first electrode than the second electrode.

10. The device of claim 8, wherein the at least two emission layers comprise at least one of a blue emission layer, a deep blue emission layer, and a sky blue emission layer.

11. The device of claim 8, wherein the at least two emission layers comprise the first emission layer and the second emission layer.

12. The device of claim 11, wherein:
   a peak wavelength of the first emission layer is within a range of 440 nm to 480 nm, and
   a peak wavelength of the second emission layer is within a range of 440 nm to 480 nm.

13. A white organic light emitting device, comprising:
   a first emission part between a first electrode and a second electrode, the first emission part having a first emission layer;
   a second emission part on the first emission part, the second emission part having a second emission layer; and
   a third emission part on the second emission part, the third emission part having a third emission layer,
   wherein emission positions of the first, second, and third emission layers are adjusted to enhance emission efficiency and a color viewing angle, based on a spectrum change rate and a cavity peak of each of the first, second, and third emission layers,
   wherein the emission position of the first emission layer is within a range of 100 nm to 150 nm with respect to the first electrode,
   wherein the emission position of the second emission layer is within a range of 240 nm to 280 nm with respect to the first electrode,
   wherein the emission position of the third emission layer is within a range of 370 nm to 410 nm with respect to the first electrode, and
   wherein a peak wavelength of the third emission layer is within a range of 540 nm to 650 nm.

14. The device of claim 13, wherein the third emission layer comprises at least one of a yellow-green emission layer, a green emission layer, a red emission layer and a green emission layer, a yellow emission layer and a red emission layer, a yellow-green emission layer and a red emission layer, or a combination thereof.

15. The device of claim 13, wherein the color viewing angle is equal to or less than 0.016 when a viewing angle of light emitted from the white organic light emitting device is 60 degrees.

16. The device of claim 13, wherein a position of the second electrode is within a range of 500 nm to 600 nm with respect to the first electrode.

17. The device of claim 13, wherein each of the first, second, and third emission parts includes at least one of a hole transport layer, a hole injection layer, a hole blocking layer, an electron transport layer, and an electron blocking layer.

18. The device of claim 13, further comprising:
   a first charge generation layer between the first emission part and the second emission part; and
   a second charge generation layer between the second emission part and the third emission part.

19. The device of claim 13, wherein at least two emission layers of the first, second, and third emission layers respectively emit light having a same color and the at least two emission layers are adjacent to each other.

20. The device of claim 19, wherein the at least two emission layers are closer to the first electrode than the second electrode.

21. The device of claim 19, wherein the at least two emission layers comprise at least one of a blue emission layer, a deep blue emission layer, and a sky blue emission layer.

22. The device of claim 19, wherein the at least two emission layers comprise the first emission layer and the second emission layer.

23. A white organic light emitting device, comprising:
a first emission part between a first electrode and a second electrode, the first emission part having a first emission layer;
a second emission part on the first emission part, the second emission part having a second emission layer; and
a third emission part on the second emission part, the third emission part having a third emission layer,
wherein emission positions of the first, second, and third emission layers are adjusted to enhance emission efficiency and a color viewing angle, based on a spectrum change rate and a cavity peak of each of the first, second, and third emission layers,
wherein the emission position of the first emission layer is within a range of 100 nm to 150 nm with respect to the first electrode,
wherein the emission position of the second emission layer is within a range of 240 nm to 280 nm with respect to the first electrode,
wherein the emission position of the third emission layer is within a range of 370 nm to 410 nm with respect to the first electrode,
wherein at least two emission layers of the first, second, and third emission layers respectively emit light having a same color and the at least two emission layers are adjacent to each other,
wherein the at least two emission layers comprise the first emission layer and the second emission layer,
a peak wavelength of the first emission layer is within a range of 440 nm to 480 nm, and
a peak wavelength of the second emission layer is within a range of 440 nm to 480 nm.

24. The device of claim 23, wherein the at least two emission layers are closer to the first electrode than the second electrode.

25. The device of claim 23, wherein the first and second emission layers comprise at least one of a blue emission layer, a deep blue emission layer, and a sky blue emission layer.

26. The device of claim 23, wherein the third emission layer comprises at least one of a yellow-green emission layer, a green emission layer, a red emission layer and a green emission layer, a yellow emission layer and a red emission layer, a yellow-green emission layer and a red emission layer, or a combination thereof.

27. The device of claim 23, wherein the color viewing angle is equal to or less than 0.016 when a viewing angle of light emitted from the white organic light emitting device is 60 degrees.

28. The device of claim 23, wherein a position of the second electrode is within a range of 500 nm to 600 nm with respect to the first electrode.

29. The device of claim 23, wherein each of the first, second, and third emission parts includes at least one of a hole transport layer, a hole injection layer, a hole blocking layer, an electron transport layer, and an electron blocking layer.

30. The device of claim 23, further comprising:
a first charge generation layer between the first emission part and the second emission part; and
a second charge generation layer between the second emission part and the third emission part.

* * * * *